(12) United States Patent (10) Patent No.: US 12,561,493 B2

Arancibia (45) Date of Patent: Feb. 24, 2026

(54) METHOD AND SYSTEM FOR OPERATING A CONFIGURATION PLATFORM

(71) Applicant: BOMBARDIER INC., Dorval (CA)

(72) Inventor: Claudio Arancibia, Candiac (CA)

(73) Assignee: BOMBARDIER INC., Dorval (CA)

( * ) Notice: Subject to any disclaimer, the term of this patent is extended or adjusted under 35 U.S.C. 154(b) by 0 days.

(21) Appl. No.: 18/087,122

(22) Filed: Dec. 22, 2022

(65) Prior Publication Data

US 2023/0127879 A1    Apr. 27, 2023

Related U.S. Application Data

(63) Continuation of application No. 16/958,634, filed as application No. PCT/CA2018/051637 on Dec. 20, 2018, now Pat. No. 11,568,097.

(60) Provisional application No. 62/611,647, filed on Dec. 29, 2017.

(51) Int. Cl.
G06F 30/15        (2020.01)
G06T 19/00        (2011.01)

(52) U.S. Cl.
CPC .............. G06F 30/15 (2020.01); G06T 19/00 (2013.01)

(58) Field of Classification Search
CPC ................................ G06T 19/00; G06F 30/15
See application file for complete search history.

(56) References Cited

U.S. PATENT DOCUMENTS 7,277,572 B2    10/2007    MacInnes et al.
8,060,345 B2    11/2011    Lee et al.

8,954,301 B2    2/2015    Sieben
9,019,266 B2    4/2015    Hoguet
9,058,464 B2    6/2015    Song et al.
9,513,622 B2    12/2016    Schmidt-Schaeffer et al.
(Continued)

FOREIGN PATENT DOCUMENTS

DE        20203367 U1    5/2003
WO      2016/128034 A1    8/2016
WO      2016/193298 A1    12/2016

OTHER PUBLICATIONS

Abbasov (Abbasov, I. B., & V'iacheslav, V. O. (2014). Computational modeling of passenger amphibian aircraft Be-200 cabin interior. Advances in Engineering Software, 76, 154-160.) (Year: 2014).*

(Continued)

*Primary Examiner* — Bijan Mapar
(74) *Attorney, Agent, or Firm* — BCF LLP

(57)                ABSTRACT

A method of and a system for propagating a configuration setting of a 3D model to other 3D models, the 3D model and the other 3Ds being part of a same 3D model category. The 5 method comprises dividing the 3D model into a first plurality of surfaces; associating to each one of the first plurality of surfaces, a unique surface identifier. For each one of the other 3D models, the method comprises dividing the one of the other 3D models into a second plurality of surfaces; establishing a correspondence; associating, for each one of the second plurality of surfaces corresponding to one of the first plurality of surfaces. The method also comprises 0 selecting the configuration setting of the 3D model; determining the unique identifier of the 3D model to which the configuration setting is to be applied; and propagating, the configuration setting to the other 3D models.

11 Claims, 23 Drawing Sheets

<u>800</u>

(56)         References Cited

U.S. PATENT DOCUMENTS

| | | | |
|---|---|---|---|
| 9,592,779 | B2 | 3/2017 | Pietsch et al. |
| 2002/0161563 | A1 | 10/2002 | Elabiad et al. |
| 2003/0078859 | A1 | 4/2003 | Coke et al. |
| 2007/0156540 | A1 | 7/2007 | Koren et al. |
| 2008/0062167 | A1 | 3/2008 | Boggs et al. |
| 2009/0216502 | A1 | 8/2009 | Booth |
| 2011/0137758 | A1 | 6/2011 | Bienias |
| 2014/0278270 | A1 | 9/2014 | Savian et al. |
| 2015/0199470 | A1 | 7/2015 | Young et al. |
| 2016/0162607 | A1 | 6/2016 | Callahan et al. |
| 2017/0011451 | A1 | 1/2017 | Kasik et al. |
| 2017/0076494 | A1 | 3/2017 | Gabrys et al. |
| 2017/0103147 | A1 | 4/2017 | Khanna et al. |

OTHER PUBLICATIONS

Koshti, S. (2007). Designing a passenger lift and transfer device using 3d modeling and kinematic simulation techniques.) (Year: 2007).*

Cao, L., Zhang, R., Chen, H., & Zhao, X. (2013). Frontal crash protection performance of integrated child safety seat (No. 2013-01-1160). SAE Technical Paper. (Year: 2013).*

International Search Report with regard to PCT/CA2018/051636 mailed on Feb. 7, 2019.

International Search Report with regard to PCT/CA2018/051637 mailed on Mar. 15, 2019.

Siljedahl, Rasmus, "3D Conversion from CAD models to polygon models", Linkopings Universitet, 2016, 19 pages.

English Abstract for DE20203367 retrieved on Espacenet on Jun. 26, 2020.

Gulfstream / Zemoga "Lifting Sales to the stratosphere", https://www.zemoga.com/case-study-gulfstream, accessed Sep. 2, 2020, pdf 5 pages.

Design Book on Behance, Zemoga, https://www.behance.net/gallery/11388475/Design-Book, accessed Sep. 2, 2020, pdf 6 pages.

Gulfstream Aerospace, http://www.gulfstream.com/company, accessed Sep. 2, 2020, pdf 7 pages.

Spruce, "Gulfstream displays DesignBook at NBAA", Oct. 2012, https://corporatejetinvestor.com/articles/gulfstream-designbook-459/, accessed Sep. 2, 2020, pdf 4 pages.

"My Gulfstream Designer", http://tracegordon.com/my-gulfstream-designer/, accessed Sep. 2, 2020, pdf 3 pages.

Garvin, "MyGulfstream Designer Promotional Video", Vimeo, https://vimeo.com/129049315, accessed Sep. 2, 2020, pdf 2 pages.

Smith, "MyGulfstream Designer walkthrough", https://vimeo.com/155334311, accessed Sep. 2, 2020, pdf 2 pages.

"Dassault Aviation leverages Serious Factory's 3D technology to revolutionize the configuration of business jets", Serious Factory, http://www.seriousfactory.com/wp-content/uploads/2013/01/PR_1501_2012_SERIOUS_FACTORY-dassault_aviation_EN.pdf, accessed Sep. 2, 2020, pdf 3 pages.

"Dassault Aviation personnalise les jets prives de ses clients", 2013, http://bfmbusiness.bfmtv.com/01-business-forum/dassault-aviation-personnalise-les-jets-prives-de-ses-clients-593039.html, accessed Sep. 2, 2020, pdf 11 pages.

"Configurateur d'avion en 3D—Dassault Aviation", https://www.youtube.com/watch?v=ZUQdNFTrMIs, accessed Sep. 2, 2020, pdf 4 pages.

Zeplin, "The Application of Virtual Reality in the Design of Aircraft Cabins", Airbus, http://www.fzt.haw-hamburg.de/pers/Scholz/dglr/hh/text_2007_05_24_Virtual_Reality.pdf, accessed Sep. 2, 2020, pdf 54 pages.

"Airbus Innovation Centre develops 3D technology to provide virtual reality new interior cabins", Airbus, https://www.youtube.com/watch?v=yKk_WijFUOA, accessed Sep. 2, 2020, pdf 4 pages.

"AIM Brings VR to Cabin Design at AIX", Flight Chic, https://flightchic.com/2017/02/15/aim-brings-vr-to-cabin-design-at-aix/, accessed Sep. 2, 2020, pdf 8 pages.

"AIM Altitude provides a sneak peek of its 2017 AIX showcase", http://www.aimaltitude.com/through-concept-and-reality/, accessed Sep. 2, 2020, pdf 4 pages.

Private Jet Design, https://vipcompletions.com/private-jet-interior-design/, accessed Sep. 2, 2020, pdf 22 pages.

GoMega, https://gomega.pl/realisation/roots-2/, accessed Sep. 4, 2020, pdf 3 pages.

Loffler et al., "Realistic Lighting Simulation for Interactive VR Applications", Joint Virtual Reality Conference of EuroVR—EGVE, 2011, https://pdfs.semanticscholar.org/9e07/f7507d3965e76e3c4af762607a2a9293a3d4.pdf, pp. 1-8.

Office Action with regard to the counterpart U.S. Appl. No. 16/958,634 mailed Aug. 19, 2021.

Abbasov et al., "Computational modeling of passenger amphibian aircraft Be-200 cabin interior", Advances in Engineering Software, vol. 76, pp. 154-160. (Year: 2014)—received from USPTO with regard to U.S. Appl. No. 16/958,634.

3ds Max, Autodesk Help, Object ID Element (Feb. 8, 2016) (Year: 2016)—received from USPTO with regard to U.S. Appl. No. 16/958,634.

3ds Max, Autodesk Help, Propagate Materials to Instances (Dec. 17, 2014) (Year: 2014)—received from USPTO with regard to U.S. Appl. No. 16/958,634.

\* cited by examiner

700

Large Aft Stateroom
Configuration 702 | 3-3-3-3 ▽

| | | |
|---|---|---|
| 701 | ◁▭ ▭ ▭ ▭ | 4-4-4 |
| 702 | ◁▭ ▭ ▭ ▭ | 3-3-3-3 |
| 703 | ◁▭ ▭ ▭▭ ▭ | 3-3-1-2-3 |
| 704 | ◁▭ ▭ ▭ ▭ | 3-3-2-4 |
| 705 | ◁▭ ▭ ▭ ▭ | 4-3-2-3 |
| 706 | ◁▭ ▭ ▭ ▭ | 3-3-2-2-3 |
| 707 | ◁▭ ▭ ▭ ▭ | 2-3-3-2-3 |

Figure 12:
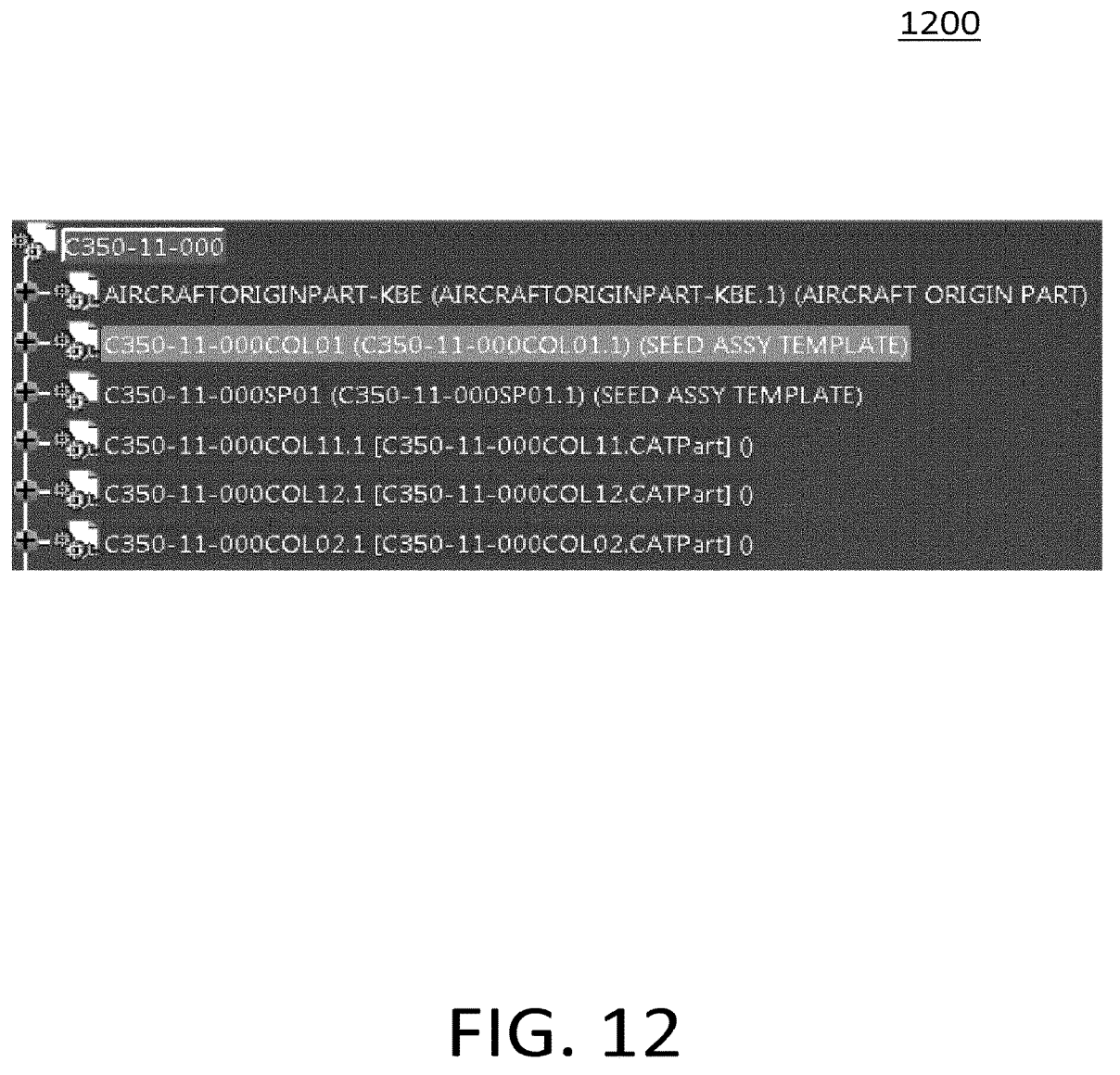

C350-11-000
AIRCRAFTORIGINPART-KBE (AIRCRAFTORIGINPART-KBE.1) (AIRCRAFT ORIGIN PART)
C350-11-000COL01 (C350-11-000COL01.1) (SEED ASSY TEMPLATE)
C350-11-000SP01 (C350-11-000SP01.1) (SEED ASSY TEMPLATE)
C350-11-000COL11.1 [C350-11-000COL11.CATPart] ()
C350-11-000COL12.1 [C350-11-000COL12.CATPart] ()
C350-11-000COL02.1 [C350-11-000COL02.CATPart] ()

RULE FORMAT:                                                        <u>1602</u>

IF: ---- THEN: ---- IS:----

---

RULE EXAMPLE 1:                                                     <u>1604</u>

IF = option #, monument, envelope, zone config,
design feature config

THEN = option #, monument, envelope, zone config,
design feature config

IS = inherent, mandatory, not available, optional

---

RULE FORMAT:                                                        <u>1606</u>

IF: ---- THEN: ---- WITH:----

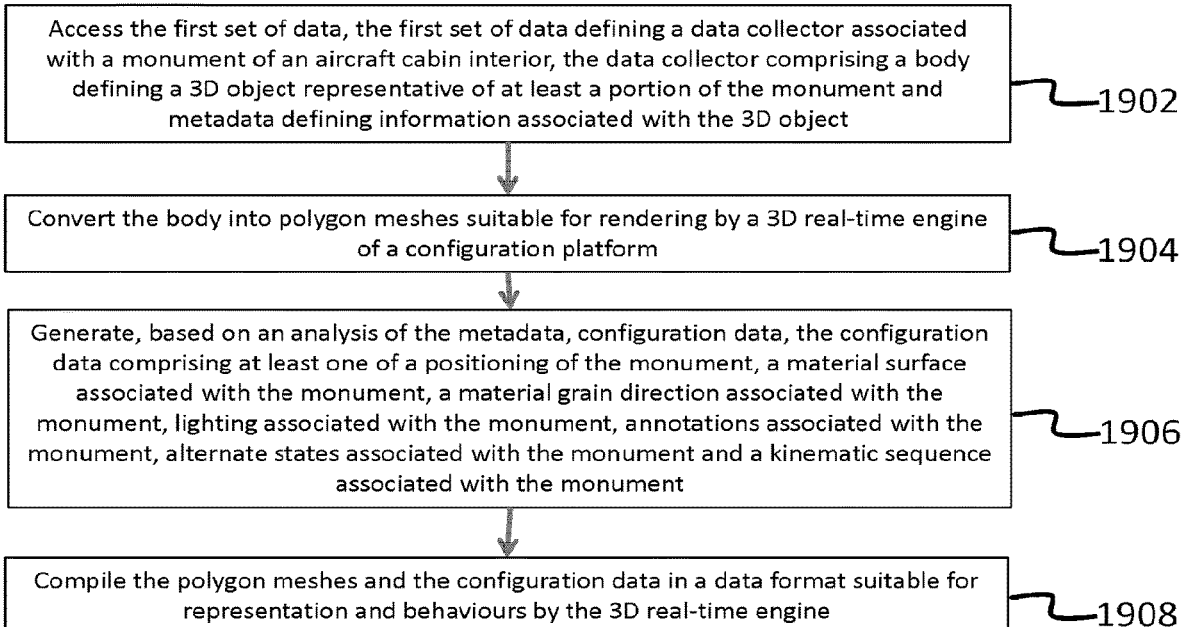

Access the first set of data, the first set of data defining a data collector associated with a monument of an aircraft cabin interior, the data collector comprising a body defining a 3D object representative of at least a portion of the monument and metadata defining information associated with the 3D object ⎯1902

Convert the body into polygon meshes suitable for rendering by a 3D real-time engine of a configuration platform ⎯1904

Generate, based on an analysis of the metadata, configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument ⎯1906

Compile the polygon meshes and the configuration data in a data format suitable for representation and behaviours by the 3D real-time engine ⎯1908

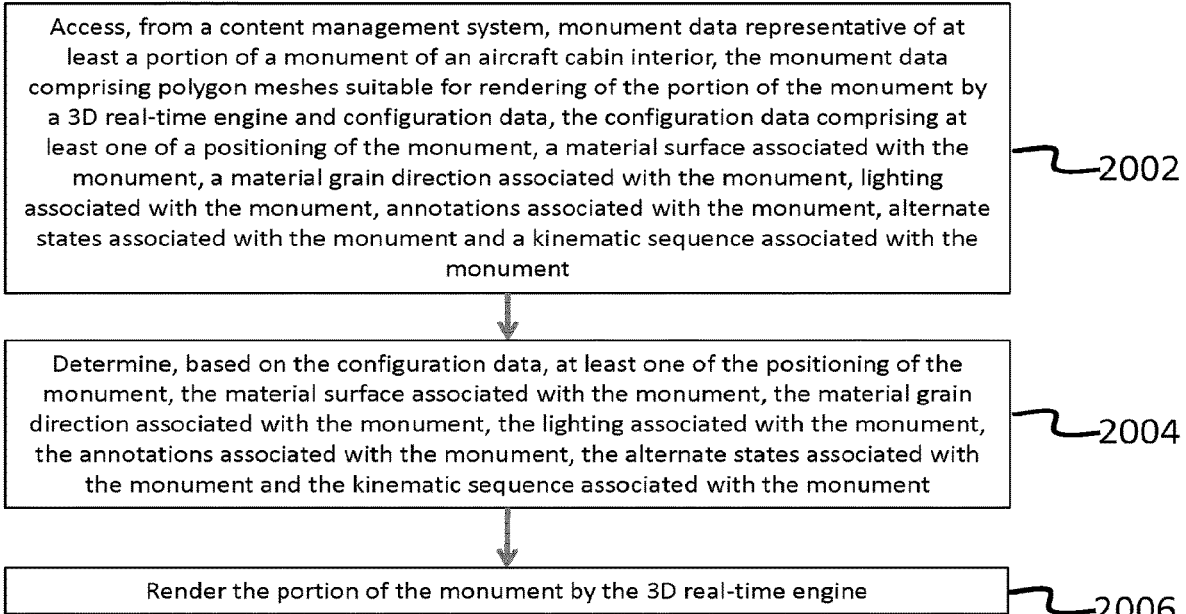

Access, from a content management system, monument data representative of at least a portion of a monument of an aircraft cabin interior, the monument data comprising polygon meshes suitable for rendering of the portion of the monument by a 3D real-time engine and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument     —2002

Determine, based on the configuration data, at least one of the positioning of the monument, the material surface associated with the monument, the material grain direction associated with the monument, the lighting associated with the monument, the annotations associated with the monument, the alternate states associated with the monument and the kinematic sequence associated with the monument     —2004

Render the portion of the monument by the 3D real-time engine     —2006

Figure 21:
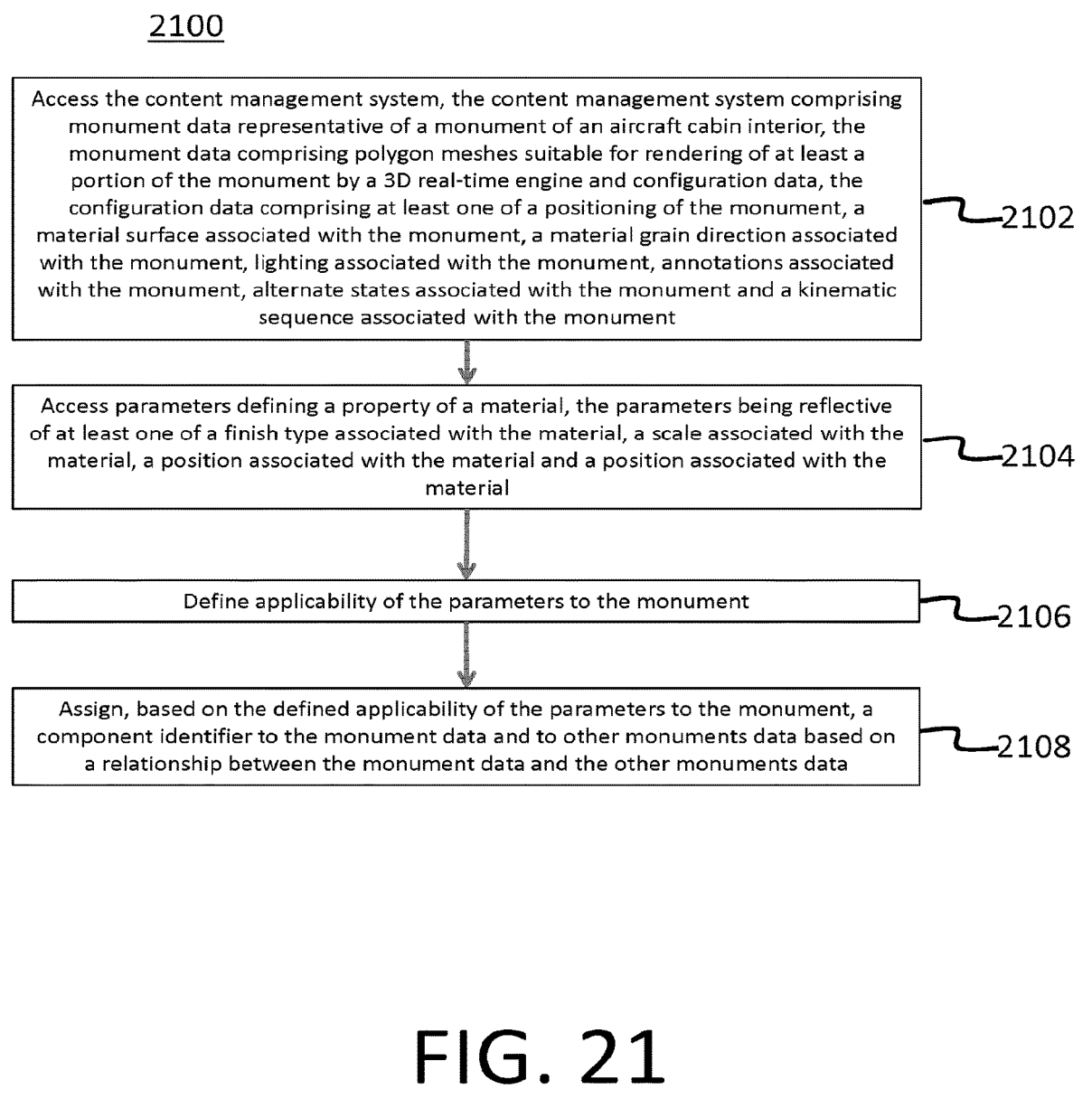

Access the content management system, the content management system comprising monument data representative of a monument of an aircraft cabin interior, the monument data comprising polygon meshes suitable for rendering of at least a portion of the monument by a 3D real-time engine and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument 2102

Access parameters defining a property of a material, the parameters being reflective of at least one of a finish type associated with the material, a scale associated with the material, a position associated with the material and a position associated with the material 2104

Define applicability of the parameters to the monument 2106

Assign, based on the defined applicability of the parameters to the monument, a component identifier to the monument data and to other monuments data based on a relationship between the monument data and the other monuments data 2108

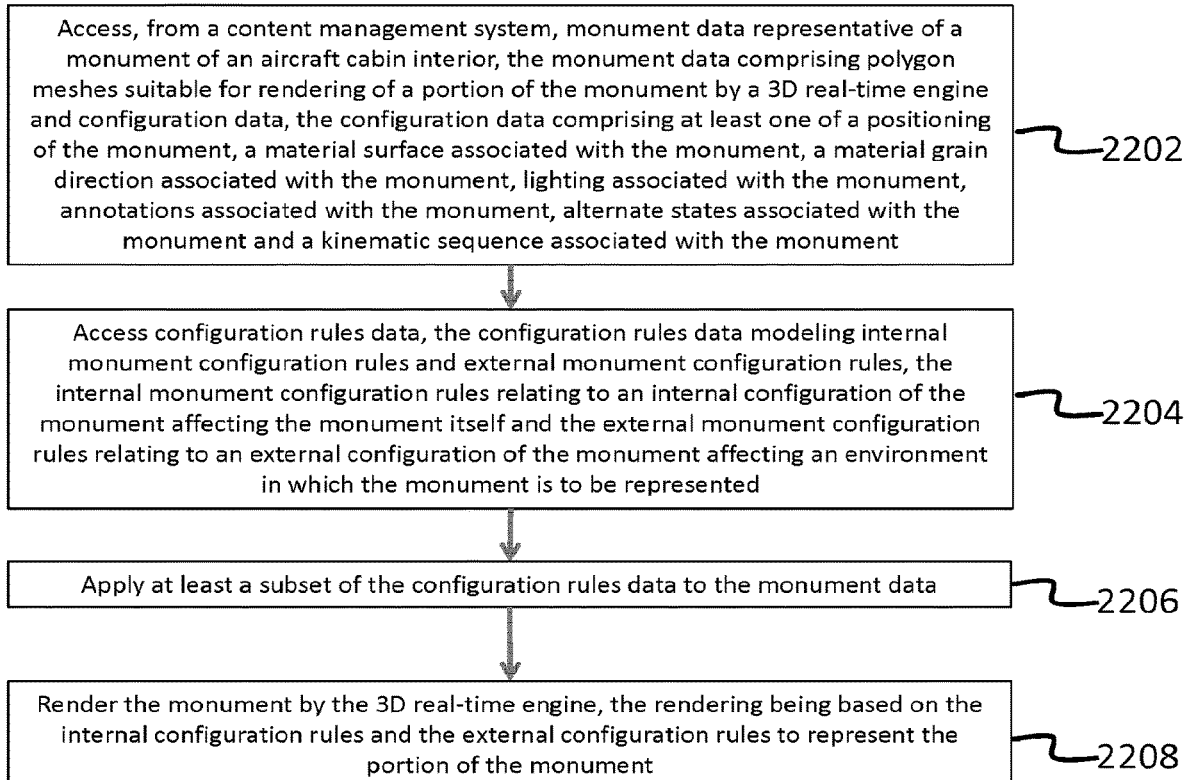

Access, from a content management system, monument data representative of a monument of an aircraft cabin interior, the monument data comprising polygon meshes suitable for rendering of a portion of the monument by a 3D real-time engine and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument

2202

Access configuration rules data, the configuration rules data modeling internal monument configuration rules and external monument configuration rules, the internal monument configuration rules relating to an internal configuration of the monument affecting the monument itself and the external monument configuration rules relating to an external configuration of the monument affecting an environment in which the monument is to be represented

2204

Apply at least a subset of the configuration rules data to the monument data

2206

Render the monument by the 3D real-time engine, the rendering being based on the internal configuration rules and the external configuration rules to represent the portion of the monument

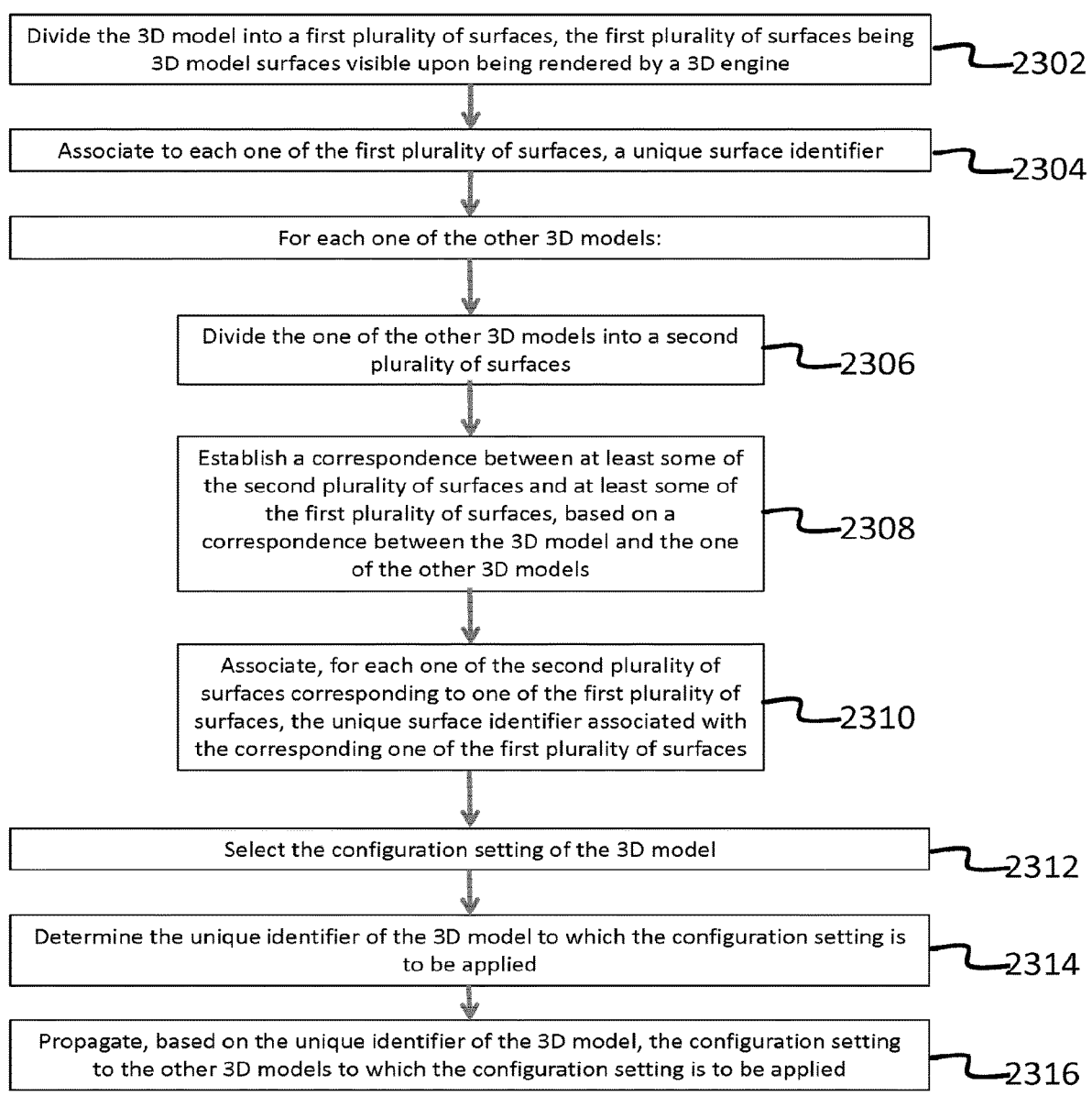

Divide the 3D model into a first plurality of surfaces, the first plurality of surfaces being 3D model surfaces visible upon being rendered by a 3D engine — 2302

Associate to each one of the first plurality of surfaces, a unique surface identifier — 2304

For each one of the other 3D models:

Divide the one of the other 3D models into a second plurality of surfaces — 2306

Establish a correspondence between at least some of the second plurality of surfaces and at least some of the first plurality of surfaces, based on a correspondence between the 3D model and the one of the other 3D models — 2308

Associate, for each one of the second plurality of surfaces corresponding to one of the first plurality of surfaces, the unique surface identifier associated with the corresponding one of the first plurality of surfaces — 2310

Select the configuration setting of the 3D model — 2312

Determine the unique identifier of the 3D model to which the configuration setting is to be applied — 2314

Propagate, based on the unique identifier of the 3D model, the configuration setting to the other 3D models to which the configuration setting is to be applied — 2316

FIG. 23

METHOD AND SYSTEM FOR OPERATING A CONFIGURATION PLATFORM

FIELD

The present application claims priority to U.S. Provisional Patent Application No. 62/611,647, filed Dec. 29, 2017, the entirety of which is incorporated herein by reference.

The present technology relates to systems and methods for operating a configuration platform. In particular, the systems and methods aim at allowing real-time configuration and real-time visualisation of 3D models, such as, but not limited to, 3D models representing aircraft cabin interiors.

BACKGROUND

High end business aircraft, such as the Challenger™ and the Global™ business aircraft from Bombardier Inc., require a high level of customisation to meet customer requirements that typically make each cabin interior unique from one aircraft to another. In addition to handling such high level of customisation, aircraft OEMs also need to ensure that standards and regulations (such as, but not limited to, regulations from the Federal Aviation Administration, Transport Canada and the European Aviation Safety Agency) are also met. This result in a highly complex process to be conducted before a final cabin interior configuration can be set and be ready for engineering and manufacturing. Such process typically comprises customer needs analysis, cabin interior configuration and optimization, cabin interior configuration rendering and multiple iterations between the aircraft OEM teams and the customer.

Cabin interior configuration modeling systems currently available require a manually intensive process that has very limited abilities to produce real-time rendering. As a result, aircraft OEM personnel has to manually capture customer requirements, for example through one or more in-person meetings with the customer (or personnel acting on behalf of the customer), to then be able to generate aircraft cabin interior prototypes, for example by using 3D CAD/CAM (computer aided design/computer aided manufacturing) tools.

Current approaches provide limited real-time interactions between the customer and an aircraft cabin interior prototype as 3D modeling may require days of work, a dedicated team and dedicated systems to properly operate the 3D CAD/CAM tool used to create a representation of the aircraft cabin interior prototype. This limitation may be even more prevalent in the context of configuring a business aircraft cabin interior, as in-person meetings between the aircraft OEM personnel and the customer may occur outside of the premises of the aircraft OEM.

In addition, aircraft cabin interior typically comprise a vast number of commodities, monuments and accessories for which corresponding engineering data is typically stored and managed by aircraft OEMs and/or suppliers of the aircraft OEMs. The engineering data may comprise all the required information to generate 3D model but typically comprise too much information and details to be efficiently use for the purpose of aircraft interior configuration. In many instances, the engineering data needs to be manually trimmed so that only information relevant to the rendering of the aircraft cabin interior are used in the context of configuring the aircraft cabin interior. This process may be cumbersome, difficult to manage and/or prone to errors and/or inconsistencies.

Due to the high level of customization of each one of the commodities, monuments and accessories and the complexity of the associated engineering data, determining appropriate configurations that meet certain constraints (e.g., customer requirements, regulations requirements, etc.) require a thorough understanding of both available customizations and constraints by the individual in charge of generating a given aircraft interior configuration. This approach may lead to substantial turnaround time between a configuration request for a given customization is made and the deliverables created of the resulting given customization (which may comprise the rendering of the given customization).

Even when the given customization is properly rendered, modifications including, for example, propagating a given customization associated with a given monument to other monuments sharing a same monument category may need to be done manually. As an example, but without being limitative, such situation may occur when there is a need for propagating a given customization of a surface material associated with an armrest of a passenger seat to surface materials associated with armrests of other passenger seats.

Improvements may be therefore desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of at least one shortcoming associated with the prior art.

In particular, such shortcomings may comprise (1) a limited ability to generate real-time rendering of aircraft cabin interiors; (2) a limited ability to provide a configuration platform that can be accessed, controlled and easily used remotely by aircraft OEMs personnel; (3) a limited ability to easily leverage engineering data for the purpose of real-time rendering and real-time configuration; (4) a limited ability to easily apply configurations rules and/or (5) a limited ability to easily propagate a given customization associated with a given monument to other monuments sharing a same monument category.

In one aspect, various implementations of the present technology provide a system for operating a configuration platform, the system comprising:

a conversion pipeline, the conversion pipeline allowing converting a first set of data associated with a computer-aided design (CAD) system into polygon meshes suitable for rendering of the portion of a monument and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument;

a content management system, the content management system storing the polygon meshes and the configuration data; and

a 3D real-time engine, the 3D real-time engine allowing
to determine, based on the configuration data, at least
one of the positioning of the monument, the material
surface associated with the monument, the material
grain direction associated with the monument, the
lighting associated with the monument, the annotations
associated with the monument, the alternate states
associated with the monument and the kinematic
sequence associated with the monument; and to render
the portion of the monument by the 3D real-time
engine.

In other aspects, various implementations of the present
technology provide a method of converting a first set of data
associated with a computer-aided design (CAD) system
polygon meshes and configuration data, the method com-
prising:

accessing the first set of data, the first set of data defining
a data collector associated with a monument of an
aircraft cabin interior, the data collector comprising a
body defining a 3D object representative of at least a
portion of the monument and metadata defining infor-
mation associated with the 3D object;

converting the body into polygon meshes suitable for
rendering by a 3D real-time engine of a configuration
platform;

generating, based on an analysis of the metadata, con-
figuration data, the configuration data comprising at
least one of a positioning of the monument, a material
surface associated with the monument, a material grain
direction associated with the monument, lighting asso-
ciated with the monument, annotations associated with
the monument, alternate states associated with the
monument and a kinematic sequence associated with
the monument; and compiling the polygon meshes and the configuration data
in a data format suitable for representation and behav-
iours by the 3D real-time engine.

In other aspects, various implementations of the present
technology provide a method of operating a configuration
platform, the method comprising:

accessing, from a content management system, monu-
ment data representative of at least a portion of a
monument of an aircraft cabin interior, the monument
data comprising polygon meshes suitable for rendering
of the portion of the monument by a 3D real-time
engine and configuration data, the configuration data
comprising at least one of a positioning of the monu-
ment, a material surface associated with the monument,
a material grain direction associated with the monu-
ment, lighting associated with the monument, annota-
tions associated with the monument, alternate states
associated with the monument and a kinematic
sequence associated with the monument;

determining, based on the configuration data, at least one
of the positioning of the monument, the material sur-
face associated with the monument, the material grain
direction associated with the monument, the lighting
associated with the monument, the annotations associ-
ated with the monument, the alternate states associated
with the monument and the kinematic sequence asso-
ciated with the monument; and rendering the portion of the monument by the 3D real-
time engine.

In other aspects, various implementations of the present
technology provide a method of updating a content man-
agement system associated with a configuration platform,
the method comprising:

4 accessing the content management system, the content
management system comprising monument data rep-
resentative of a monument of an aircraft cabin interior,
the monument data comprising polygon meshes suit-
able for rendering of at least a portion of the monument
by a 3D real-time engine and configuration data, the
configuration data comprising at least one of a posi-
tioning of the monument, a material surface associated
with the monument, a material grain direction associ-
ated with the monument, lighting associated with the
monument, annotations associated with the monument,
alternate states associated with the monument and a
kinematic sequence associated with the monument;

accessing parameters defining a property of a material, the
parameters being reflective of at least one of a finish
type associated with the material, a scale associated
with the material, a position associated with the mate-
rial and a position associated with the material;

defining applicability of the parameters to the monument;
and assigning, based on the defined applicability of the param-
eters to the monument, a component identifier to the
monument data and to other monuments data based on
a relationship between the monument data and the other
monuments data.

In other aspects, various implementations of the present
technology provide a method of applying configuration
rules, the configuration rules relating to an operation of a
configuration platform, the method comprising:

accessing, from a content management system, monu-
ment data representative of a monument of an aircraft
cabin interior, the monument data comprising polygon
meshes suitable for rendering of a portion of the
monument by a 3D real-time engine and configuration
data, the configuration data comprising at least one of
a positioning of the monument, a material surface
associated with the monument, a material grain direc-
tion associated with the monument, lighting associated
with the monument, annotations associated with the
monument, alternate states associated with the monu-
ment and a kinematic sequence associated with the
monument;

accessing configuration rules data, the configuration rules
data modeling internal monument configuration rules
and external monument configuration rules, the internal
monument configuration rules relating to an internal
configuration of the monument affecting the monument
itself and the external monument configuration rules
relating to an external configuration of the monument
affecting an environment in which the monument is to
be represented;

applying at least a subset of the configuration rules data to
the monument data; and rendering the monument by the 3D real-time engine, the
rendering being based on the internal configuration
rules and the external configuration rules to represent
the portion of the monument.

In other aspects, various implementations of the present
technology provide a method of propagating a configuration
setting of a 3D model to other 3D models, the 3D model and
the other 3Ds being part of a same 3D model category, the
method comprising:

dividing the 3D model into a first plurality of surfaces, the
first plurality of surfaces being 3D model surfaces
visible upon being rendered by a 3D engine;

associating to each one of the first plurality of surfaces, a
unique surface identifier;

for each one of the other 3D models:

dividing the one of the other 3D models into a second plurality of surfaces;

establishing a correspondence between at least some of the second plurality of surfaces and at least some of the first plurality of surfaces, based on a correspondence between the 3D model and the one of the other 3D models;

associating, for each one of the second plurality of surfaces corresponding to one of the first plurality of surfaces, the unique surface identifier associated with the corresponding one of the first plurality of surfaces;

selecting the configuration setting of the 3D model;

determining the unique identifier of the 3D model to which the configuration setting is to be applied; and propagating, based on the unique identifier of the 3D model, the configuration setting to the other 3D models to which the configuration setting is to be applied.

In other aspects, various implementations of the present technology provide a computer-based system, such as, for example, but without being limitative, an electronic device comprising at least one processor and a memory storing program instructions for operating a configuration platform, the program instructions being executable by one or more processors of the computer-based system to carry out one or more of the above-recited methods.

In other aspects, various implementations of the present technology provide a non-transitory computer-readable medium storing program instructions for operating a configuration platform, the program instructions being executable by a processor of a computer-based system to carry out one or more of the above-recited methods.

In the context of the present specification, unless expressly provided otherwise, an "electronic device", an "electronic device", a "server", a, "remote server", and a "computer-based system" are any hardware and/or software appropriate to the relevant task at hand. Thus, some non-limiting examples of hardware and/or software include computers (servers, desktops, laptops, netbooks, etc.), smartphones, tablets, network equipment (routers, switches, gateways, etc.) and/or combination thereof In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives.

In the context of the present specification, a "database" is any structured collection of data, irrespective of its particular structure, the database management software, or the computer hardware on which the data is stored, implemented or otherwise rendered available for use. A database may reside on the same hardware as the process that stores or makes use of the information stored in the database or it may reside on separate hardware, such as a dedicated server or plurality of servers.

In the context of the present specification, unless expressly provided otherwise, an "indication" of an information element may be the information element itself or a pointer, reference, link, or other indirect mechanism enabling the recipient of the indication to locate a network, memory, database, or other computer-readable medium location from which the information element may be retrieved. For example, an indication of a file could include the file itself (i.e. its contents), or it could be a unique file descriptor identifying the file with respect to a particular file system, or some other means of directing the recipient of the indication to a network location, memory address, database table, or other location where the file may be accessed. As one skilled in the art would recognize, the degree of precision required in such an indication depends on the extent of any prior understanding about the interpretation to be given to information being exchanged as between the sender and the recipient of the indication. For example, if it is understood prior to a communication between a sender and a recipient that an indication of an information element will take the form of a database key for an entry in a particular table of a predetermined database containing the information element, then the sending of the database key is all that is required to effectively convey the information element to the recipient, even though the information element itself was not transmitted as between the sender and the recipient of the indication.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns. Thus, for example, it should be understood that, the use of the terms "first server" and "third server" is not intended to imply any particular order, type, chronology, hierarchy or ranking (for example) of/between the server, nor is their use (by itself) intended imply that any "second server" must necessarily exist in any given situation. Yet as another example, it should be understood that, the use of the terms "first direction" and "third direction" is not intended to imply, unless specified otherwise, any particular order, type, chronology, hierarchy or ranking (for example) of/between the directions, nor is their use (by itself) intended imply that any "second direction" must necessarily exist in any given situation. Further, as is discussed herein in other contexts, reference to a "first" element and a "second" element does not preclude the two elements from being the same actual real-world element. Thus, for example, in some instances, a "first" server and a "second" server may be the same software and/or hardware, in other cases they may be different software and/or hardware.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIGS. 4 to 7 are screenshots illustrating embodiments of graphical user interfaces in accordance with embodiments of the present technology;

FIGS. 11 and 12 illustrate screenshots showing material properties associated with a monument in accordance with embodiments of the present technology;

FIG. 16 illustrates rule formats and a rule example in accordance with embodiments of the present technology;

FIG. 19 is a flowchart illustrating a first computer-implemented method implementing embodiments of the present technology;

FIG. 20 is a flowchart illustrating a second computer-implemented method implementing embodiments of the present technology;

FIG. 21 is a flowchart illustrating a third computer-implemented method implementing embodiments of the present technology;

FIG. 22 is a flowchart illustrating a fourth computer-implemented method implementing embodiments of the present technology; and FIG. 23 is a flowchart illustrating a fifth computer-implemented method implementing embodiments of the present technology.

Figure 1:
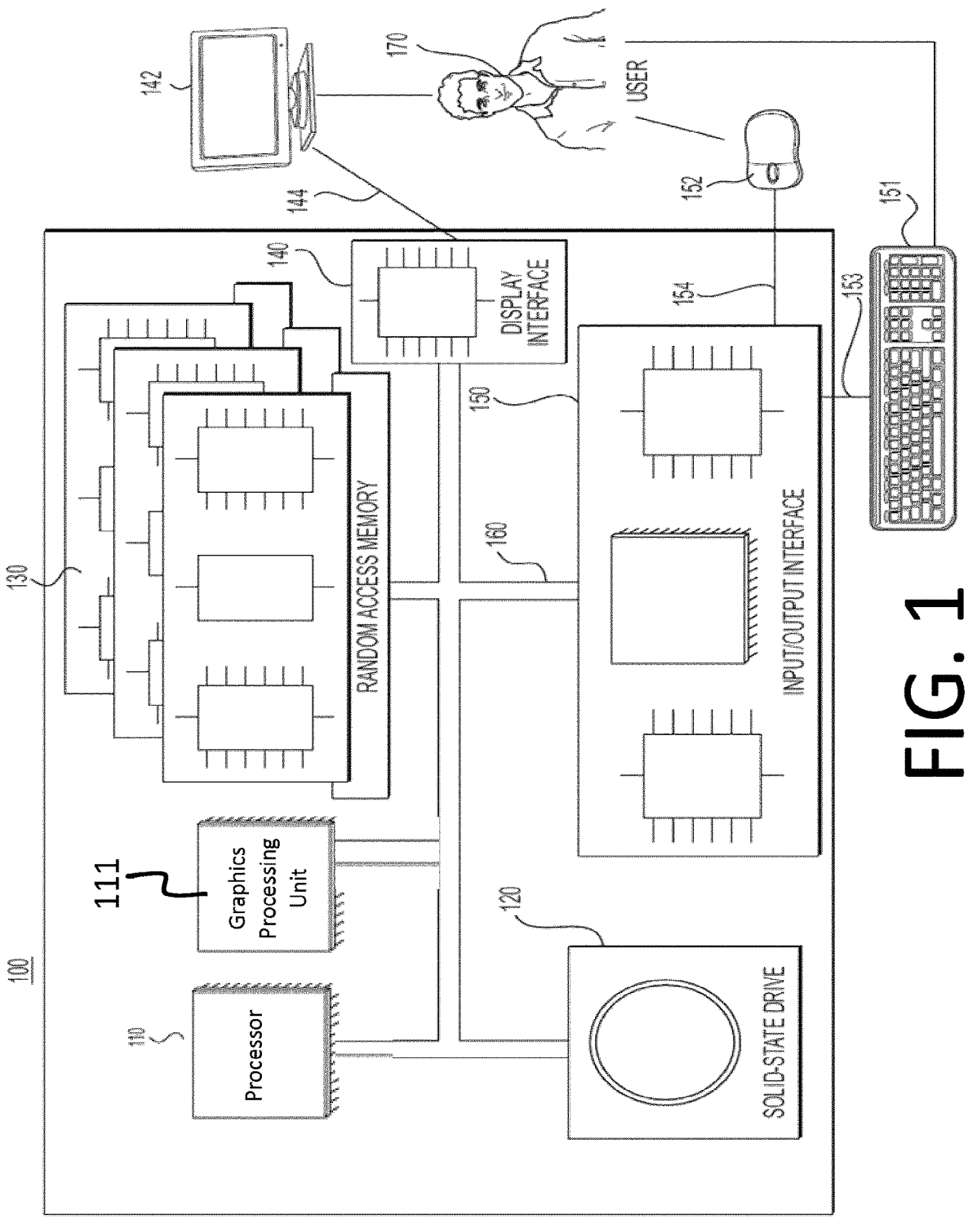
FIG. 1 is a diagram of a computer system suitable for implementing the present technology and/or being used in conjunction with implementations of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

The functions of the various elements shown in the figures, including any functional block labeled as a "processor" or a "graphics processing unit", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general purpose processor, such as a central processing unit (CPU) or a processor dedicated to a specific purpose, such as a graphics processing unit (GPU). Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

With these fundamentals in place, we will now consider some non-limiting examples to illustrate various implementations of aspects of the present technology.

Referring to FIG. 1, there is shown a computer system 100 suitable for use with some implementations of the present technology, the computer system 100 comprising various hardware components including one or more single or multi-core processors collectively represented by processor 110, a graphics processing unit (GPU) 111, a solid-state drive 120, a random access memory 130, a display interface 140, and an input/output interface 150.

Communication between the various components of the computer system 100 may be enabled by one or more internal and/or external buses 160 (e.g. a PCI bus, universal serial bus, IEEE 1394 "Firewire" bus, SCSI bus, Serial-ATA bus, etc.), to which the various hardware components are electronically coupled. The display interface 140 may be coupled to a monitor 142 (e.g. via an HDMI cable 144)

visible to a user 170, and the input/output interface 150 may be coupled to a touchscreen (not shown), a keyboard 151 (e.g. via a USB cable 153) and a mouse 152 (e.g. via a USB cable 154), each of the keyboard 151 and the mouse 152 being operable by the user 170.

According to implementations of the present technology, the solid-state drive 120 stores program instructions suitable for being loaded into the random access memory 130 and executed by the processor 110 and/or the GPU 111 to operate a configuration platform. For example, the program instructions may be part of a library or an application.

Figure 2:
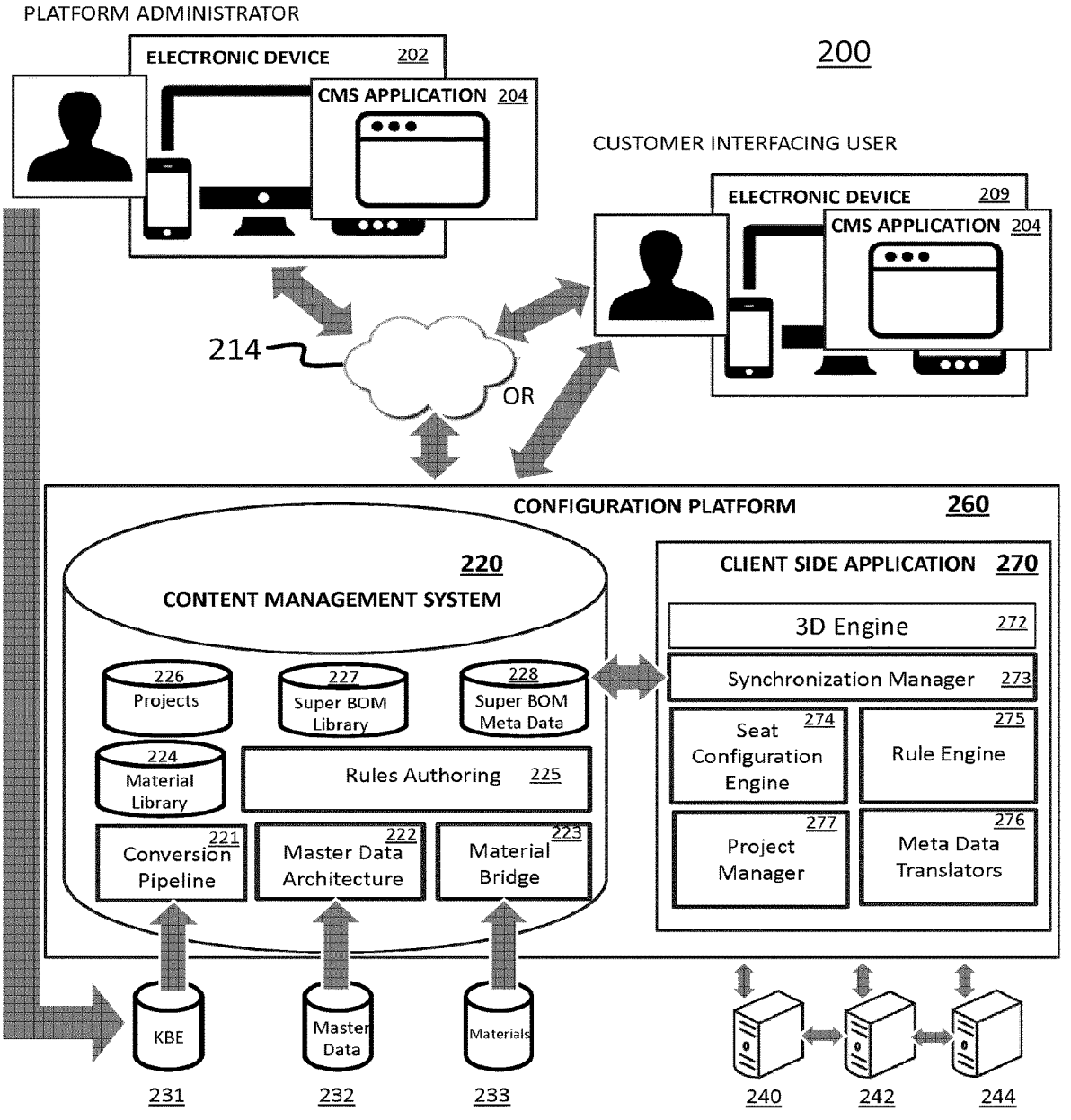
FIG. 2 is a diagram of a networked computing environment in accordance with an embodiment of the present technology.

In FIG. 2, there is shown a networked computing environment 200 suitable for use with some implementations of the present technology. The networked computing environment 200 comprises a first electronic device 202 and a second electronic device 209. Each of the first electronic device 202 and the second electronic device 209 may also be referred to as a "client device", an "electronic device" or an "electronic device associated with the user". Each of the first electronic device 202 and the second electronic device 209 may be associated with users. For the purpose of illustrating the present technology, the first electronic device 202 is associated with an administrator of the configuration platform 260 (i.e., a platform administrator) and the second electronic device 209 is associated with a person using the configuration platform 260 so as to configure and render a configuration of a given product (i.e., a customer interfacing user). As an example, the customer interfacing user may be a person acting on behalf of a product OEM engaged in a relationship with a customer, a person acting on behalf of the customer and/or the customer herself/himself. As an example, the platform administrator and/or the customer interfacing user may be the user 170.

Even though reference is made to a platform administrator, the term "administrator" should be broadly construed as an individual having a broader access to the configuration platform 260 than the customer interfacing user so as to be able to "administrate" the configuration platform 260. Also, even though reference is made to a customer interfacing user, the term "user" should be broadly construed as an individual using the configuration platform 260 so as to configure and render configuration of a given product.

It should also be noted that the fact that the first electronic device 202 and the second electronic device 209 are respectively associated with the platform administrator and the customer interfacing user, it does not need to suggest or imply any mode of operation—such as a need to log in, a need to be registered or the like.

The implementation of the first electronic device 202 and the second electronic 209 is not particularly limited, but as an example, the first electronic device 202 and the second electronic 209 may be implemented as a personal computer (desktops, laptops, netbooks, etc.), a wireless communication device (a cell phone, a smartphone, a tablet and the like), a virtual reality device or an augmented reality device. The first electronic device 202 and the second electronic 209 may each comprise hardware and/or software and/or firmware (or a combination thereof), as is known in the art, to execute an application 204. Generally speaking, the purpose of the application 204 is to enable a platform administrator and/or a customer interfacing user to execute various functions relating to managing settings of the configuration platform and/or controlling the configuration platform so as to render and configure a given product. To that end, the application 204 comprises various graphical user interface (GUI) elements which are discussed in greater details in the paragraphs below.

How the application 204 is implemented is not particularly limited. One example of the application 204 may be embodied in the platform administrator and the customer interfacing user accessing a web site associated with a configuration platform. For example, the application 204 can be accessed by typing in an URL. It should be expressly understood that the application 204 can be accessed using any other commercially available or proprietary Internet browser (such as, but not limited to, Chrome™ from Alphabet Inc., Internet Explorer™ from Microsoft Inc., Safari™ from Apple Inc.).

In alternative non-limiting embodiments of the present technology, the application 204 may be implemented as a dedicated application running on the first electronic device 202 and/or the second electronic device 209. In such embodiments, the application 204 may be referred to as a "client application" and the configuration platform 260 as a "server application".

In alternative non-limiting embodiments of the present technology where the first electronic device 202 or the second electronic device 209 is implemented as a portable device, the first electronic device 202 or the second electronic device 209 may be an "app" available on an app store such as the App Store™ from Apple. It should be expressly understood that any other commercially available or proprietary browser application or any available or proprietary app can be used for implementing non-limiting embodiments of the present technology.

The first electronic device 202 and the second electronic device 209 may be coupled to a communications network 214 via a communication link (not shown). In some embodiments, the first electronic device 202 is directly connected to the configuration platform (for example, via an Intranet or via direct physical connection to the configuration platform). In some non-limiting embodiments of the present technology, the communications network 214 can be implemented as the Internet. In other embodiments of the present technology, the communications network 214 can be implemented differently, such as any wide-area communications network, local-area communications network, a private communications network and the like.

How the communication link (not shown) is implemented is not particularly limited and will depend on how the first electronic device 202 or the second electronic device 209 is implemented. Merely as an example and not as a limitation, in those embodiments of the present technology where the first electronic device 202 or the second electronic device 209 is implemented as a wireless communication device (such as a tablet), the communication link (not shown) can be implemented as a wireless communication link (such as but not limited to, a 3G communications network link, a 4G communications network link, a Wireless Fidelity, or WiFi® for short, Bluetooth® and the like). In those examples, where the first electronic device 202 or the second electronic device 209 is implemented as a notebook computer, the communication link can be either wireless (such as the Wireless Fidelity, or WiFi® for short, Bluetooth® or the like) or wired (such as an Ethernet based connection).

It should be expressly understood that implementations for the first electronic device 202 or the second electronic device 209, the communication link (not shown) and the communications network 214 are provided for illustration purposes only. As such, those skilled in the art will easily appreciate other specific implementational details for the first electronic device 202 or the second electronic device 209, the communication link (not shown) and the communications network 214. As such, by no means, examples provided herein above are meant to limit the scope of the present technology.

Also coupled to the communication network 214 is the configuration platform 260. In some embodiments, the configuration platform 260 may be enabled by one or more servers 240, 242 and 244. The servers 240, 242, 244 can be implemented as conventional computer servers. In an example of an embodiment of the present technology, the servers 240, 242, 244 can be implemented as Dell™ PowerEdge™ Servers running the Microsoft™ Windows Server™ operating system. Needless to say, the servers 240, 242, 244 can be implemented in any other suitable hardware and/or software and/or firmware or a combination thereof. In the depicted non-limiting embodiment of present technology, the servers 240, 242, 244 define a distributed architecture relying on multiple servers. In alternative non-limiting embodiments of the present technology, the functionality of the servers 240, 242, 244 may be on a single server.

Overall Platform

One or more of the servers 240, 242, 244 operates a configuration platform 260. In the illustrated example of FIG. 2, the configuration platform 260 comprises a client side application 270 and a Content Management System (CMS) 220. In the embodiment illustrated at FIG. 2, the client side application 270 comprises multiple software modules, namely, a 3D engine 272, a synchronization manager 273, a seat configuration engine 274, a rule engine 275, metadata translators 276 and a project manager 277. The CMS 220 comprises multiple software modules, namely, a conversion pipeline 221, a master data architecture module 222, a material bridge 223, a material library 224, a rules authoring module 225, a material library database 224, a projects database 226, a super Bill Of Material (BOM) database 227 and a super Bill Of Material (BOM) metadata database 228. The conversion pipeline 221 may access a Knowledge Base Engineering (KBE) database 231. The master data architecture module 232 may access a master data database 232. The material bridge 223 may access a materials database 233. More details relating to the various software modules of the client side application 270 and the CMS 220 will be provided in the paragraphs below.

The general purpose of the configuration platform 260 is to allow, amongst other functionalities, a platform administrator and/or a customer interfacing user to (1) generate real-time rendered visual results of a configuration of a product (such as an aircraft cabin interior and/or an aircraft exterior); (2) provide remote control of the configuration of the product which may comprise operating the configuration platform remotely without server connectivity; (3) leverage engineering data for the purpose of real-time rendering and real-time configuration of the product; (4) apply configurations rules and/or (5) propagate a given customization associated with a given element of the product (such as a monument or a seat in the case of a configuration of an aircraft cabin interior) to other monuments sharing a same monument category.

As it will be understood by a person skilled in the art of the present technology, software modules illustrated at FIG. 2 are provided as an example and many variations may be therefore envision without departing from the scope of the present technology. This aspect should not be construed as being limitative of the scope of the present technology.

In the exemplified embodiment, the 3D engine 272 (which may equally be referred to a 3D rendering engine or a 3D real-time engine) allows 3D rendering of polygon meshes in real-time meaning that a user may virtually move and/or manipulate 3D objects in real-time via the configuration platform 260. As an example, a user may virtually move into an aircraft cabin interior and/or change a line of sight while moving into the aircraft cabin interior. In some embodiments, the 3D rendering is rendered from a first-person point of view which allows intuitively represent a cabin interior as if the user was virtually in the rendered aircraft cabin interior. In some embodiments, the 3D rendering provides a fully immersive environment based on real-time calculations of lighting, reflections and shadows. In some embodiments, the 3D rendering may be rendered on a regular 2D display, a 3D display and/or a virtual/augmented reality headset so to provide a user with a visual experience of how she/he would perceive a given configuration of the aircraft cabin interior in real-life. In some embodiments, the 3D engine 272 is the Unreal Engine™ game engine from Epic Games Inc. Other game engines may equally be used without departing from the scope of the present technology.

In some embodiments the configuration platform 260 may be described as a system for operating a configuration platform. The system may comprise a conversion pipeline (such as the conversion pipeline 221), a content management system (such as the CMS 220) and a 3D real-time engine (such as the 3D engine 272). In some embodiments, the conversion pipeline allows converting a first set of data associated with a computer-aided design (CAD) system into polygon meshes suitable for rendering of the portion of a monument and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument.

In some embodiments, the content management system stores the polygon meshes and the configuration data. In some embodiments, the 3D real-time engine allows to determine, based on the configuration data, at least one of the positioning of the monument, the material surface associated with the monument, the material grain direction associated with the monument, the lighting associated with the monument, the annotations associated with the monument, the alternate states associated with the monument and the kinematic sequence associated with the monument; and to render the portion of the monument by the 3D real-time engine.

In some embodiments, the system comprises a material bridge (such as the material bridge 223), the material bridge being configured to access parameters defining a property of a material, the parameters being reflective of at least one of a finish type associated with the material, a scale associated with the material, a position associated with the material, a position associated with the material and a position associated with the material; define applicability of the parameters to the monument; and assign, based on the defined applicability of the parameters to the monument, a component identifier to the monument data and to other monuments data based on a relationship between the monument data and the other monuments data.

In some embodiments, the system further comprises a rule engine (such as the rule engine 275), the rule engine being configured to: access configuration rules data, the configuration rules data modeling internal monument configuration rules and external monument configuration rules, the internal monument configuration rules relating to an internal configuration of the monument affecting the monument and the external monument configuration rules relating to an external configuration of the monument affecting an environment in which the monument is to be represented; apply at least a subset of the configuration rules data to the monument data; and render the monument by the 3D real-time engine, the rendering being based on the internal configuration rules and the external configuration rules to represent the portion of the monument.

In some embodiments, the system comprises a configuration engine (such as the seat configuration engine 274), the configuration engine being configured to propagate a configuration setting of a 3D model to other 3D models, the 3D model and the other 3Ds being part of a same 3D model category.

Even though the configuration platform 260 may be used in connection with the configuration of multiple types of products (e.g., a vehicle interior such as a car, a boat, a train, a building interior and the like), the embodiments set forth in the paragraphs below illustrates configuration of an aircraft cabin interior. It should be understood that these embodiments are provided as an example and should not be construed as being limitative.

Example of an Aircraft Cabin Interior

Figure 3:
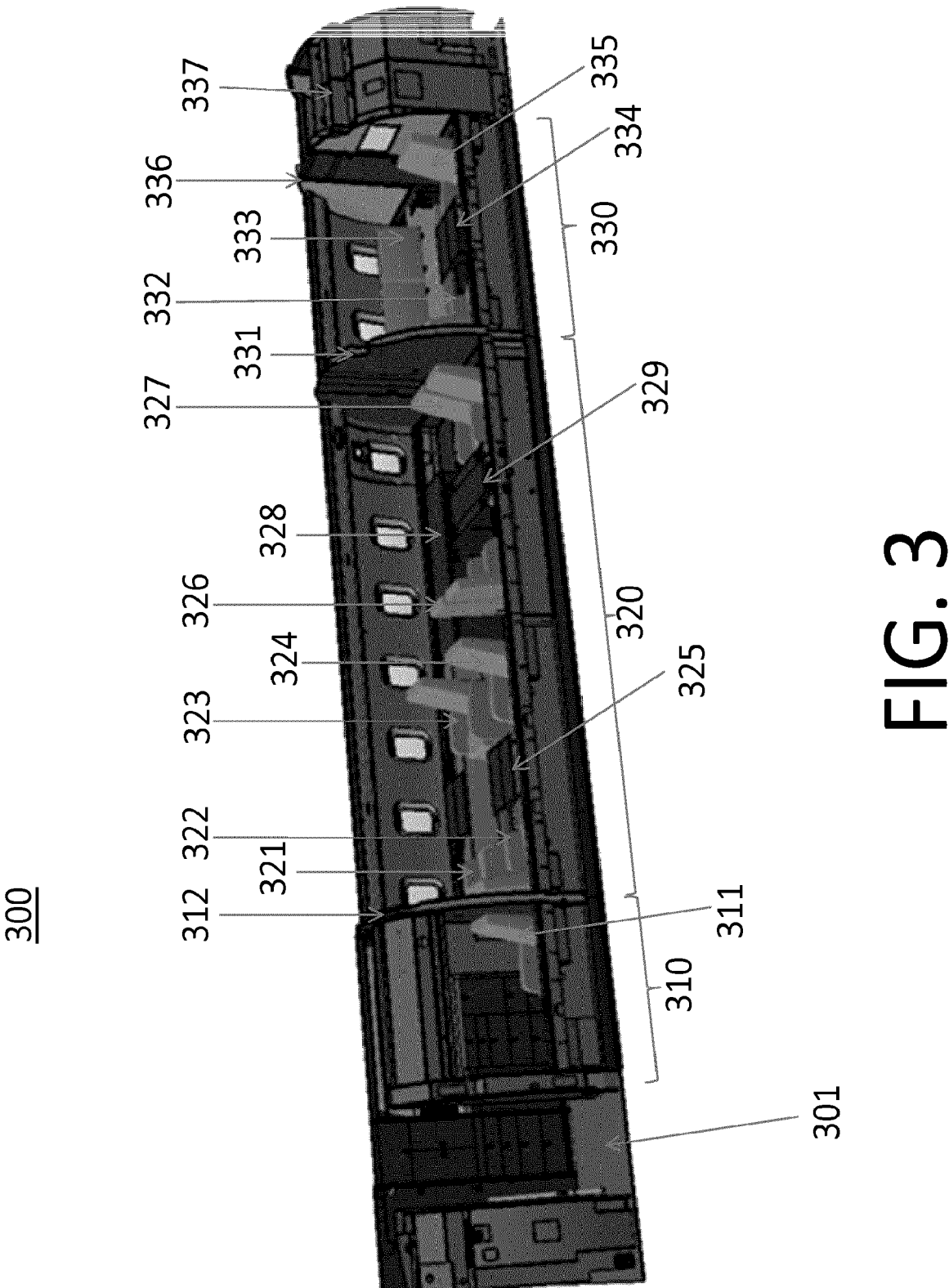
FIG. 3 is a perspective view of an aircraft cabin interior in accordance with an embodiment of the present technology.

Turning now to FIG. 3, an example of an aircraft cabin interior 300 is provided. As a person skilled in the art may appreciate, the aircraft cabin interior 300 illustrates a cabin interior of a business aircraft, such as, but without being limitative, a Global 7000™ from Bombardier Inc. The aircraft cabin interior 300 extends longitudinally from an entry area 301 of the aircraft to a rear section 337 of the aircraft. The aircraft cabin interior 300 is divided in multiple zones, namely a first zone 310, a second zone 320 and a third zone 330. According to embodiments of the present technology, a "zone" may be defined as a section of the aircraft cabin that extends from a first position to a second position. In some embodiments, the first position is defined as a position of a first bulkhead and the second position is defined as a position of a second bulkhead. In some embodiments, the first bulkhead and the second bulkhead may be referred to as "zone dividers" as they physically divide volumes of the aircraft cabin interior 300 so as to create a visual impression of multiple "areas" or "rooms" through the aircraft cabin. As it may be appreciated by the person skilled in the art of the present technology, bulkheads may have multiple shapes and dimensions.

Referring back to FIG. 3, the first zone 310 extends from the entry area 301 to a first bulkhead 312. Amongst other elements, the first zone 310 comprises a seat 311. The second zone 320 extends from the first bulkhead 312 to a second bulkhead 331. The second zone 320 comprises a set of seats 321, 322, 323 and 324 and a table 325. The second zone 320 also comprises a second set of double seats 326 and 327, a credenza 328 and a table 329. Reference is made to "double seat(s)" so as to convey the notion of two individual seats merged into a single structural unit. In some embodiments, the second zone 320 may be referred to as a "double zone" as it spreads across a volume of two "single zones" (such as the third zone 330). In the illustrated embodiment, the second zone 320 may accommodate eight passengers during take-off and landing of the aircraft. The third zone 330 extends from the second bulkhead 331 to a third bulkhead 336. The third zone 330 comprises a set of seats 332 and 335, a table 334 and a divan 333. In the illustrated embodiment, the third zone 330 may accommodate four passengers during take-off and landing of the aircraft.

Figure 4:
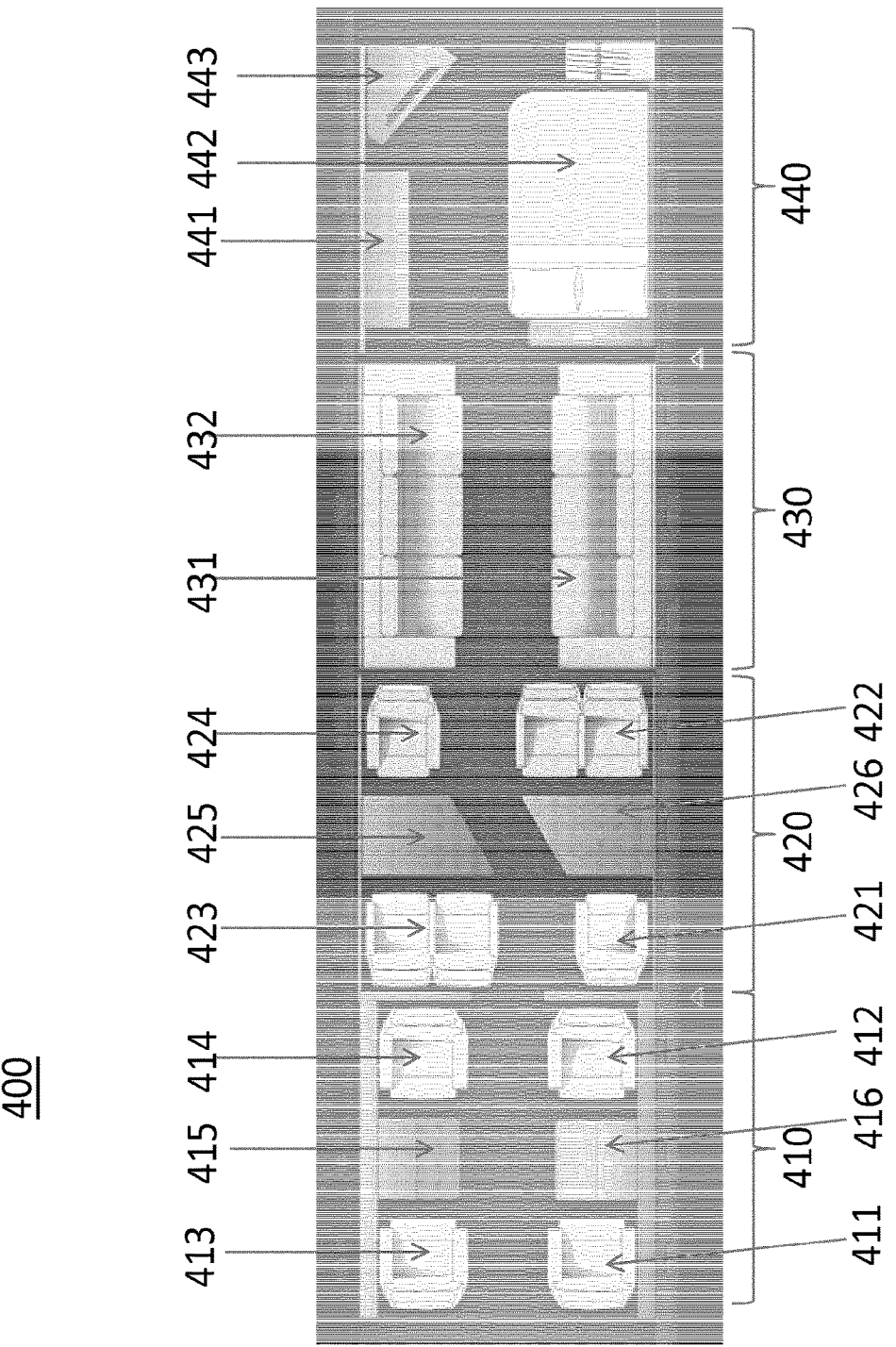

Turning now to FIG. 4, a top plan view of an aircraft cabin interior 400 is represented. In the illustrated embodiment, the representation of the aircraft cabin interior 400 is taken from a screenshot illustrating an embodiment of a Graphical User Interface (GUI) component provided by the configuration platform 260 to a user of the configuration platform 260 (such as a platform administrator or a customer interfacing user). In some embodiments, the GUI component allows the user of the configuration platform 260 to select a configuration for each one of the zones of the aircraft cabin interior and/or configure one or more elements of each one of the zones of the aircraft cabin interior. The one or more elements may comprise seats, tables, monuments (e.g., credenza), divans, beds and the like.

The aircraft cabin interior 400 comprises four zones, namely a first zone 410, a second zone 420, a third zone 430 and a fourth zone 440. The first zone 410 comprises a first set of seats 411, 412, 413 and 414, a first table 415 and a second table 416. The second zone 420 comprises a set of single seats 421, 424, a set of double seats 422, 423 and table comprising two sections 425, 426 that may be configured to form a single conference table accommodating six passengers. The third zone 430 comprises a first divan 431 and a second divan 432. Each one of the first divan 431 and the second divan 432 may accommodate up to six passengers during take-off and landing. The fourth zone 440 comprises a first credenza 441, a second credenza 443 and a double bed 442.

Figure 5:
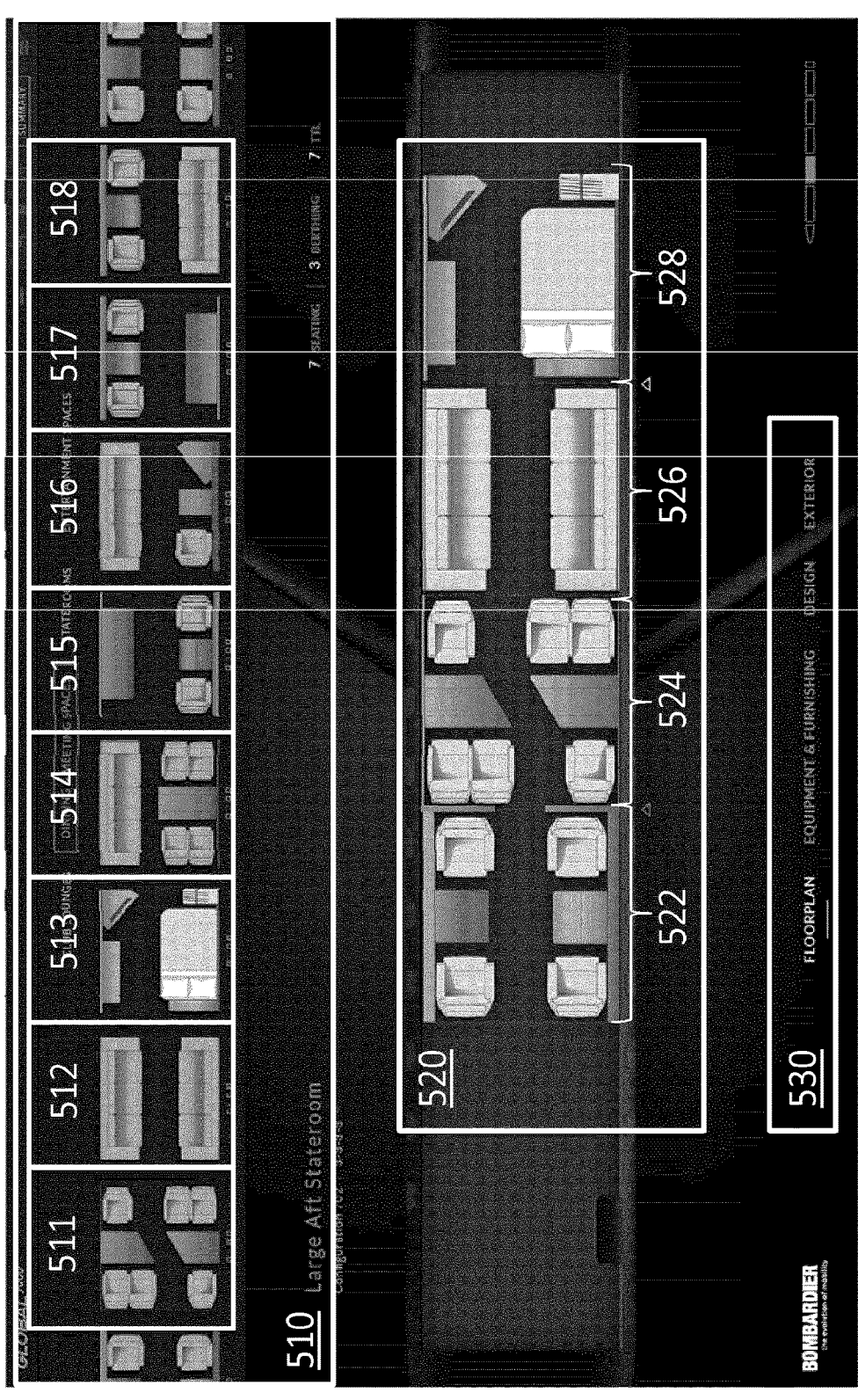

Turning now to FIG. 5, a screenshot 500 illustrates an embodiment of a GUI provided by the configuration platform 260 to the user of the configuration platform 260. The screen shot 500 comprises three GUI components, namely a first GUI component 510, a second GUI component 520 and a third GUI component 530. In the illustrated embodiment, the first GUI component 510 is a horizontal scrolling menu allowing the user to select a specific layout for a given zone of the aircraft cabin interiors. Various examples of layouts 511-518 are illustrated showing multiple combinations of seats, tables, credenzas, beds and divans. The second GUI component 520 illustrates a current configuration of an aircraft cabin interior which the user may modify by dragging and dropping one or more layouts 511-518 into the second GUI component 520. The aircraft cabin interior illustrated in the second GUI component 520 is similar to the aircraft cabin interior illustrated in FIG. 4 with a first zone 522 corresponding to the first zone 410, a second zone 524 corresponding to the second zone 420, a third zone 526 corresponding to the third zone 430 and a fourth zone 528 corresponding to the fourth zone 440. The third GUI component 530 provides the user with the ability to switch from one configuration screen to another. In the illustrated embodiment, the user may switch from "floorplan" (current selection representing the first GUI component 510 and the second GUI component 520) to "equipment & furnishing", "design" and/or "exterior".

Example of a GUI

Figure 6:
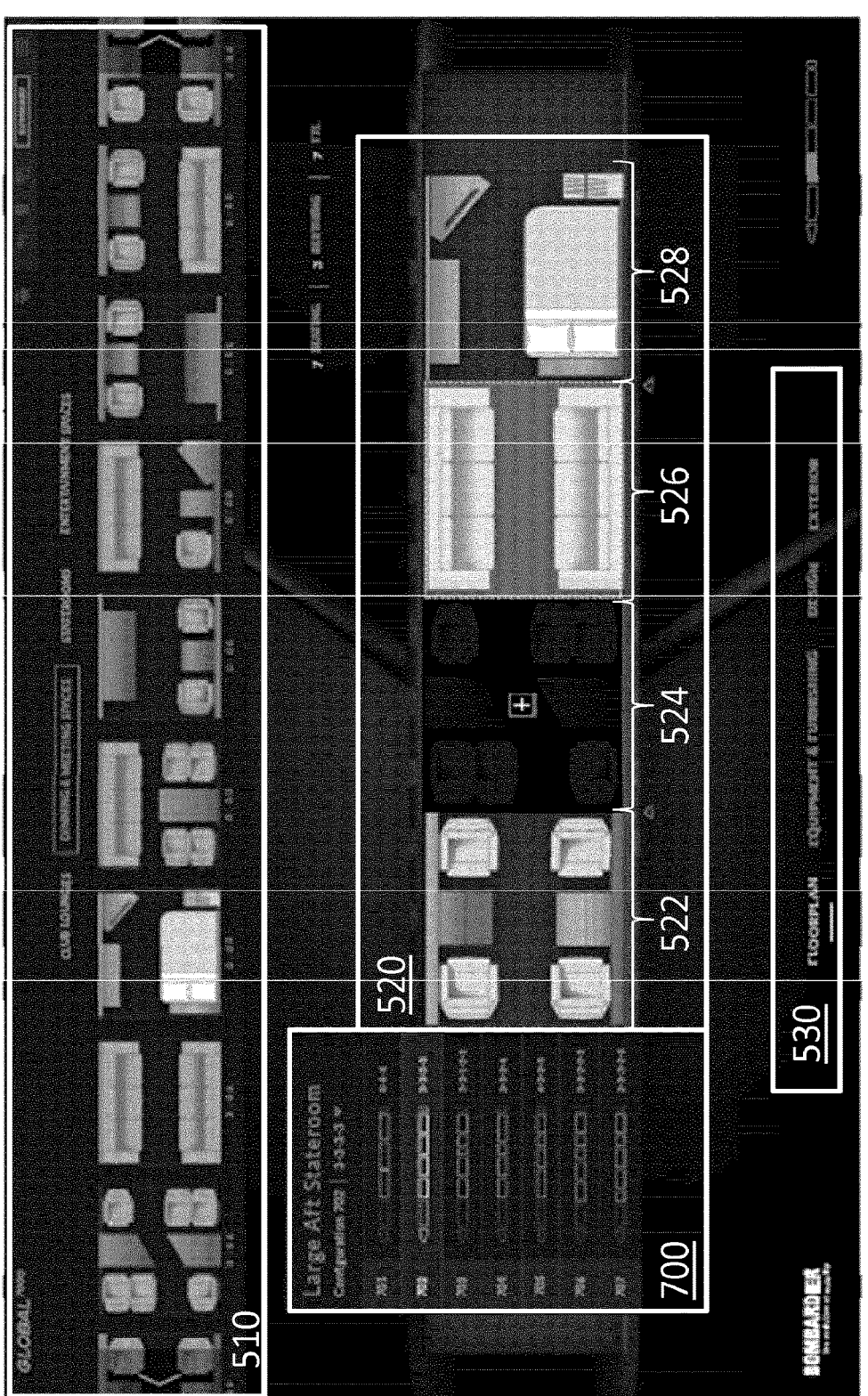
Figure 7:
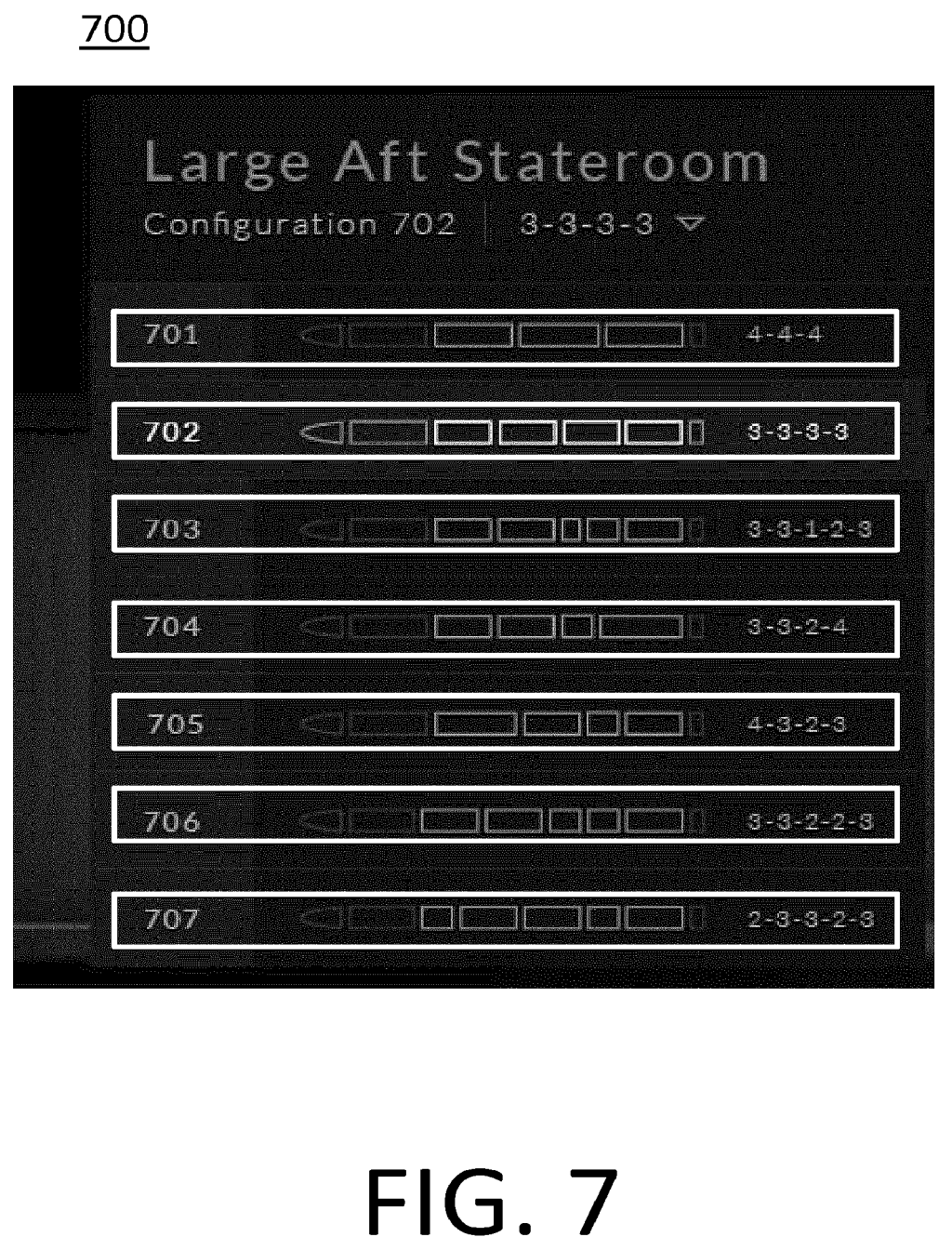

Turning now to FIG. 6, a screenshot 600 illustrates an embodiment of a GUI provided by the configuration platform 260 to the user of the configuration platform 260. The screen shot 600 comprises the first GUI component 510 of FIG. 5, the second GUI component 520 of FIG. 5 and the third GUI component 530 of FIG. 5. In the embodiment illustrated in FIG. 6, only the first zone 522, the third zone 526 and the fourth zone 528 are selected while the second zone 524 is left blank. In some embodiments, the user may select a layout from the first GUI component 510 and drag and drop it into the second GUI component 520, for example, so as to populate the second zone 524 with a selected layout. Also shown in FIG. 6 is an aircraft cabin interior layout selector 700. An embodiment of the aircraft cabin interior layout selector 700 is illustrated in FIG. 7. Multiple cabin layouts 701-707 are illustrated with a currently selected cabin layout being 702. As it may be appreciated by the person skilled in the art of the present technology, various configurations are associated with one or more digits, each representing a number of passengers during take-off or landing in a given zone. As an example, the cabin layout 701 is associated with the layout "4-4-4" meaning that the selected layout is made of three zones, each spanning four windows in length. Other examples of cabin layouts are also represented by the cabin layouts 702-707.

Figure 8:
FIG. 8 illustrates a 3D rendering of an aircraft cabin interior in accordance with an embodiment of the present technology.

Turning now to FIG. 8, a 3D rendering 800 of an aircraft cabin interior is illustrated. The 3D rendering 800 represents a given configuration 820 generated by 3D engine 272 of the configuration platform 260 which comprises a first sideledge 821 and a second sideledge 825, a first seat 822, a second seat 823, a pair of rear seats 827, a divan 826, a bulkhead 830 and a floor 824. The 3D rendering 800 also comprises a GUI component 810 similar to the third GUI component 530 of FIG. 5. In some embodiments, the 3D rendering is rendered in real-time meaning that a user may virtually move into the aircraft cabin interior and/or change a line of sight. In some embodiments, the 3D rendering is rendered from a first-person point of view which allows intuitively represent a cabin interior as if the user was virtually in the rendered aircraft cabin interior. In some embodiments, the 3D rendering is generated by a 3D engine such as the 3D engine 272 described in connection with FIG. 2. In some embodiments, the 3D rendering provides a fully immersive environment based on real-time calculations of lighting, reflections and shadows. In some embodiments, the 3D rendering may be rendered on a regular 2D display, a 3D display and/or a virtual/augmented reality headset so to provide a user with a visual experience of how she/he would perceive a given configuration of the aircraft cabin interior in real-life.

Additional Software Modules

Figure 9:
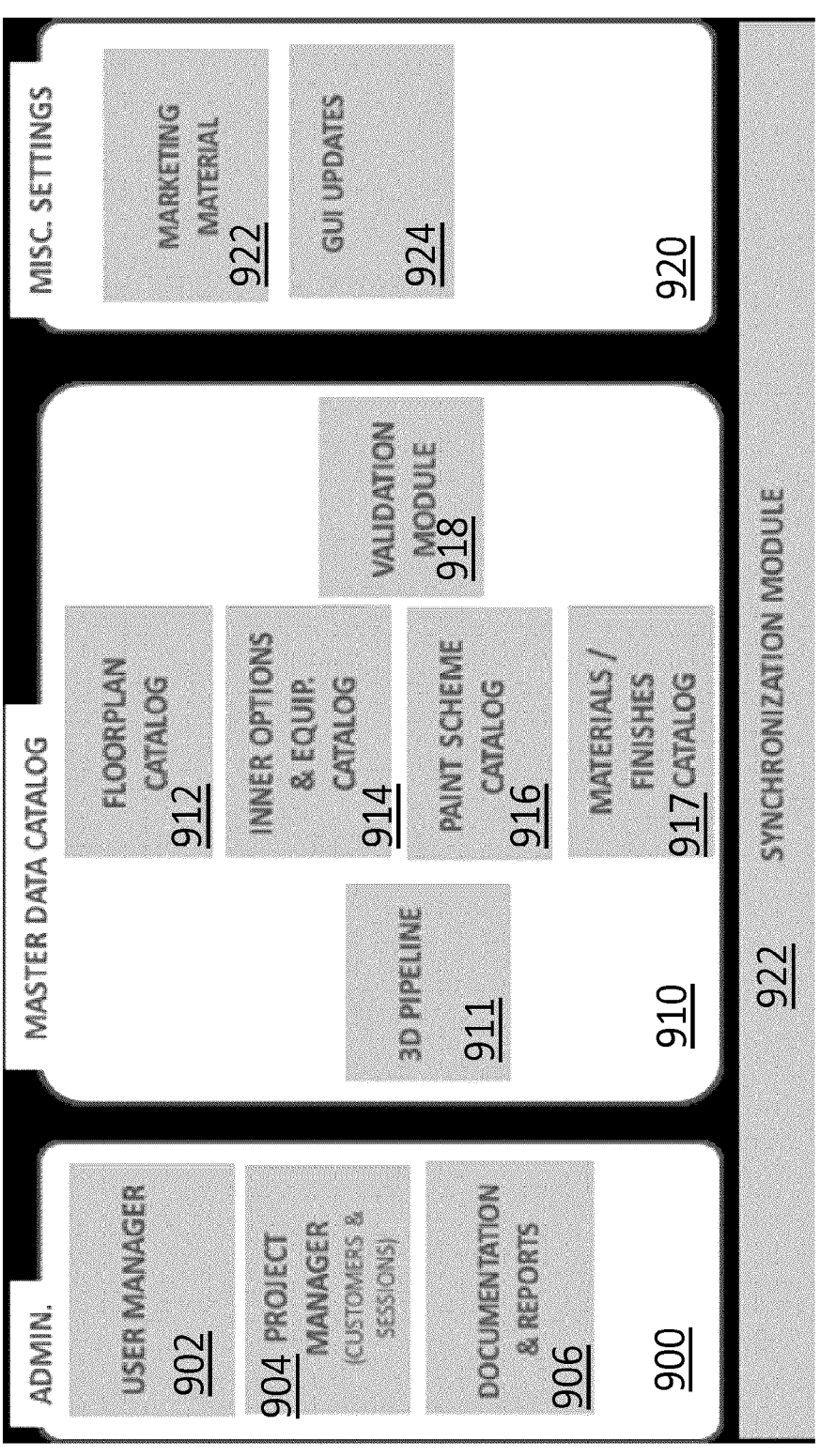
FIGS. 9 and 10 illustrate diagrams of various additional software modules in accordance with embodiments of the present technology.

Turning now to FIG. 9, various additional software modules that may be implemented by the configuration platform 270 are illustrated. In the illustrated embodiment, the various software modules comprise an administrator module 900, a master data catalog 910 and a miscellaneous settings module 920. In some embodiments, the administrator module 900 may only be accessible by a platform administrator and may allow execution of one or more of a user manager module 902 which may be part of the project manager module 277, a project manager module 904 which may be part of the project manager module 277 and a documentation and reports module 906. In some embodiments, the user manager module 902 may allow to manage access rights to the configuration platform 270. In some embodiments, the project manager module 904 may allow to manage, store, restore and/or render aircraft cabin interior configurations partially or completely defined by one or more users which may be stored in the projects database 226. In some embodiments, the documentation and reports module 906 may allow generation of documentation and reports associated with one or more aircraft cabin configurations. In some embodiments, the generated documentation and reports may be used for presenting information to a client, support the engineering and the manufacturing of a given aircraft cabin interior configuration and/or presenting information to certification authorities.

In the illustrated embodiment, the master data catalog module 910 may be implemented via the master data architecture module 222, the material bridge 223, the master data 232, the materials database 233 and/or the material library database 224. The master data catalog module 910 may comprise a 3D pipeline 911 (which may be implemented by the conversion pipeline 221), a floorplan catalog 912, an inner options and equipment catalog 914, a paint scheme catalog 916, a materials/finishes catalog 917 and a validation module 918. Each one of the floorplan catalog 912, the inner options and equipment catalog 914, the paint scheme catalog 916, the materials/finishes catalog 917 may store data relating to available configurations of various elements of the aircraft and/or of the associated cabin interior. In some embodiments, the validation module 918 may allow to control and/or validate one or more combinations of configurations selected from one of the floorplan catalog 912, the inner options and equipment catalog 914, the paint scheme catalog 916, the materials/finishes catalog 917.

In the illustrated embodiment, the miscellaneous settings module 920 comprises a marketing material module 922 and a GUI updates module 924. In some embodiments, the marketing material module 922 and the GUI updates module 924 may only be accessible by certain categories of users (e.g., platform administrator). The marketing material module 922 may allow generating marketing material based on one or more aircraft cabin interior configurations. The GUI updates module 924 may allow updating one or more aspects of the GUI components that are presented to a user of the configuration platform 270.

Figure 10:
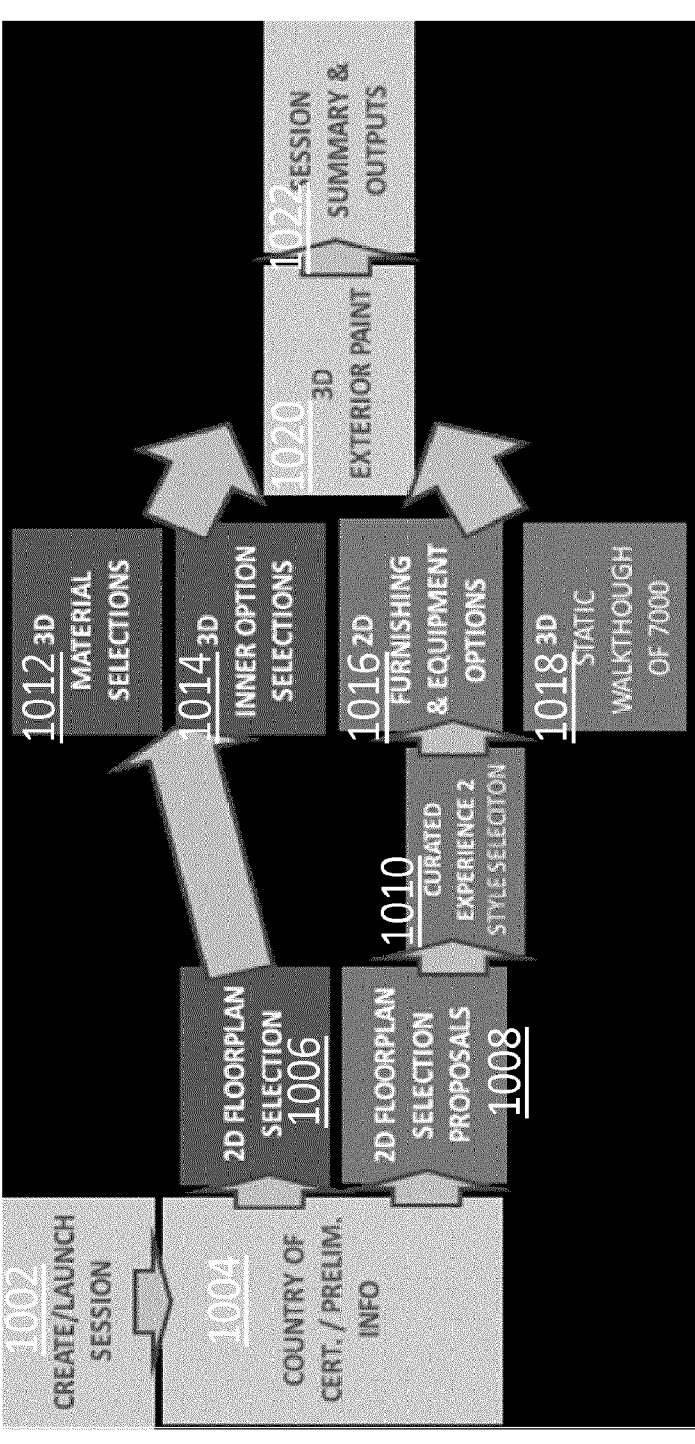
Figure 11:
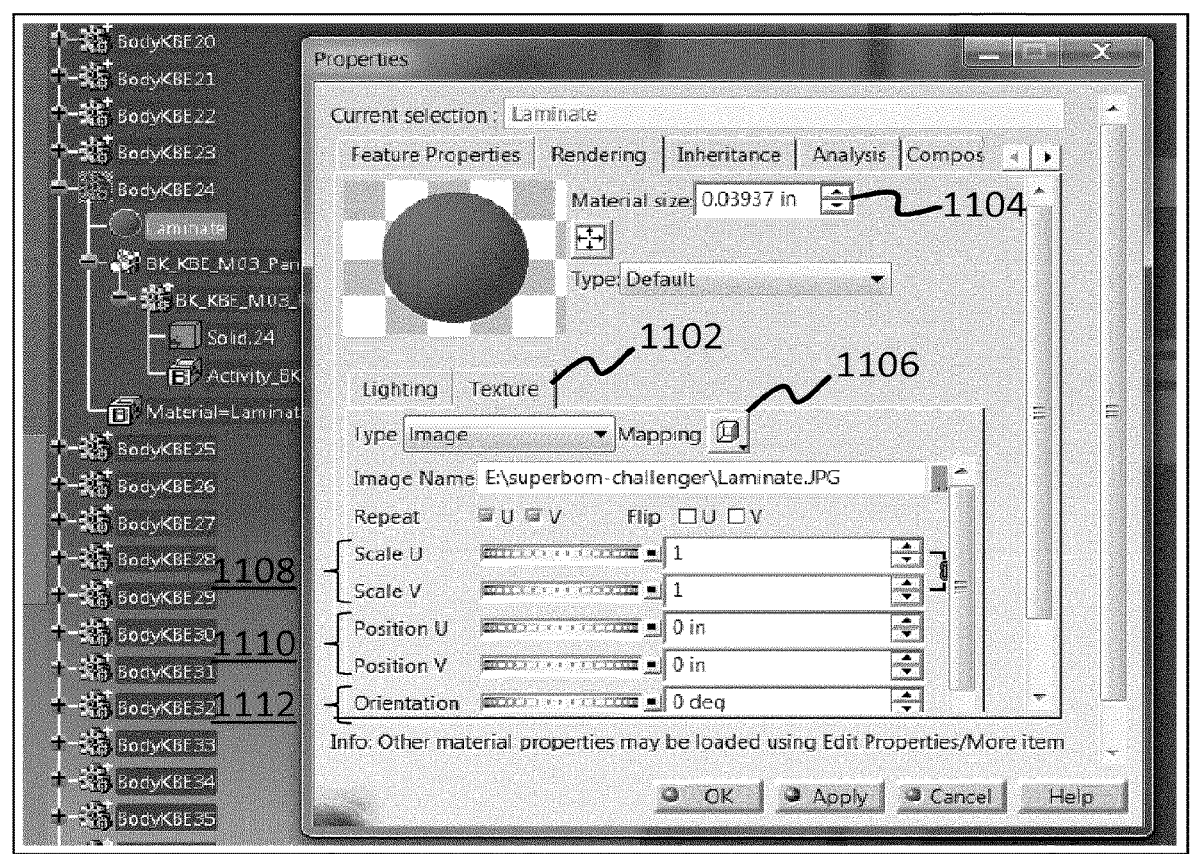
Figure 13:
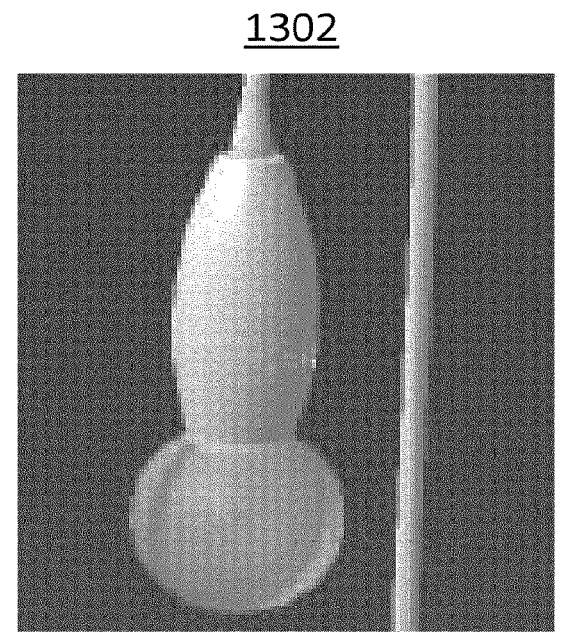
FIG. 13 illustrates variations of lighting modeling in accordance with embodiments of the present technology.
Figure 13:
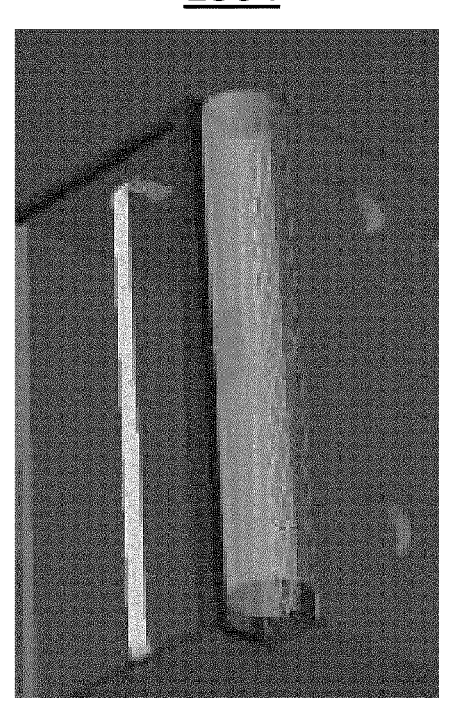
Figure 13:
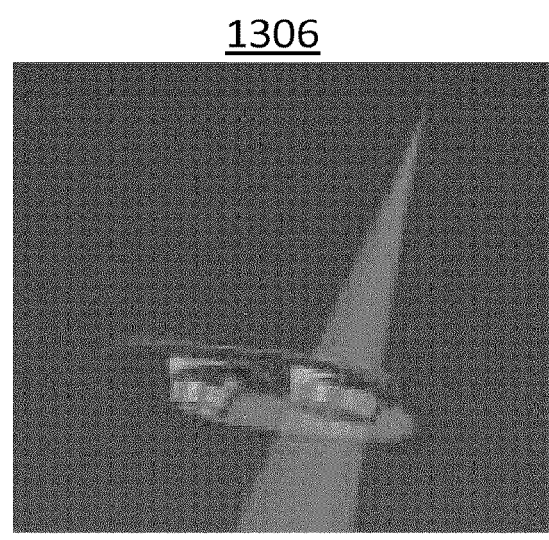

Turning now to FIG. 10, a flowchart 100 illustrates a sequence of steps that may be presented to a user of the configuration platform 270 so as to generate one or more configurations of a product (such as an aircraft and its associated cabin interior). In the illustrated embodiment, a first step 1002 aims at creating and/or launching a session with the configuration platform 270. Then a second step 1004 aims at capturing information relating to a country of certification and/or other preliminary information. In some embodiments, the captured information relating to the country of certification may impact how certain rules are applied during the various steps of the configuration so as to ensure that a generated configuration complies with the regulations of the selected country of certification. A user may then select to proceed to a third step 1006 and/or a fourth step 1008. In some embodiments, the third step 1006 may prompt the user to complete a selection of a 2D floor plan (so at to complete a 2D floor plan configuration such as the one illustrated at FIG. 4). In some embodiments, the fourth step 1008 may propose pre-stored 2D floor plan selections to the user. The fourth step 1008 may then proceed to a fifth step 1010 which allow a style selection.

In some embodiments, further to a completion of steps 1006 or 1010, steps 1012-1018 may be executed. In some embodiments, the sixth step 1012 may allow the user to proceed to a selection of 3D material, the seventh step 1014 may allow the user to proceed to a selection of 3D inner option, the eighth step 1016 may allow the user to select a 2D furnishing and equipment and a ninth step 1018 may allow the user to conduct a static walkthrough of a representation of the aircraft and/or aircraft cabin interior. In some embodiments, steps 1020 and 1022 may be executed. Step 1020 may allow a 3D representation of an aircraft exterior paint. Step 1022 may allow generation of a session summary and/or other outputs.

Turning now to FIG. 11 to FIG. 15, various aspects of the present technology will be described.

Monument Levels

As detailed in the background section of the present document, cabin interiors of business aircraft may be extensively customizable. Each cabin interior may be purpose-built to suit customers' requirements and preferences. In some embodiments of the present technology, a variability of customization may be defined in terms of monuments. In some embodiments, a monument may be defined as self-contained elements which may collectively make up an aircraft cabin interior. In some embodiments, a monument may comprise structural elements such as, but not limited to, sidewalls, sideledges, bulkheads. In some embodiments, a monument may comprise furniture such as, but not limited to, seats (single seats, double seats), divans, credenzas, cabinets, beds. In some embodiments, a monument may comprise functional elements such as, but not limited to, galleys and/or toilets.

Customizability (equally referred to configurability) of monuments may comprise disposition of the monuments within the aircraft cabin as well as an internal configuration of the monuments. In some embodiments, a configuration of a monument may be defined at multiple levels. As an example, a first level may be a monument envelope, a second level may be a configuration zone and a third level may be a design feature.

Regarding the first level, each monument envelope being associated with a given variation of the monument. For example, a front face of a credenza may be flat, curved inboard or curved outboard. In some embodiments, a choice of monument envelope for a monument may affect some or all of the components of the monument.

Regarding the second level, monuments may be divided into configuration zones, each of which may be customized. As an example, a credenza of a cabin interior of a Global 7000™ from Bombardier Inc. comprises three envelopes and three configuration zones, one of which determines the presence or absence of shelves.

Regarding additional third level customization, the design features and their respective configurations may comprise customizable decorative/aesthetic elements such as inlays, different shapes of latches and the like.

Conversion Pipeline

In accordance with some aspects of the present technology, a conversion pipeline may support input documents in Catia format (e.g., .CATPart and/or .CATProduct file extensions associated with Catia V5™ from Dassault Systems). In some embodiments, the conversion pipeline is implemented by the conversion pipeline 221. As a person skilled in the art of the present technology may appreciate, Catia documents may be nested—e.g., a document contained in one file may include, by reference, a sub-document contained in a different file. Input files for a conversion pipeline in accordance with the present technology may contain one or more KBE collectors. In some embodiments, the KBE collectors may be basic collectors (also referred to as "COL") or standard part collectors (also referred to as "SP"). In some embodiments, each one of the KBE collectors may contain 3D geometry and/or metadata about different characteristics of the part. In some embodiments, each one of the KBE collectors may be identified by a specific naming convention.

In some embodiments, basic collectors may generally contain a representation of the large-scale structure of a monument, as an example, but without being limitative, panels making up drawers, doors, cushions and the like. An example of naming convention may be as follows: C350-79-000COLL01, which may translate into collector #01 from monument 79 of the Challenger 350™ dataset.

In some embodiments, standard part collectors may generally contain a representation of structural hardware (also referred to as accessories) associated with a monument, as an example, but without being limitative, hinges, latches, handles and the like. An example of naming convention may be as follows: GXRS0000-0000-14-000SP05, which may translate into SP collector #05 from monument 14 of the Global 6000™ dataset.

Each collector is required to have a "definition" metadata attribute to define it as an element of the monument's configurability as well as its relationship to other collectors which make up the monument. In some embodiment, the definition attribute may be an alphanumeric string, prefixed with "COL_" or "SP_" depending on the collector type and may be unique for a given aircraft dataset. In some embodiments, a format may be associated with each one of an envelope collector, a zone configuration collector and a design feature collector. In the following examples, alphanumeric character or decimal digit are replaced by either @ sign or # sign.

As a first example, "MA@@ S##" may define an envelope collector. The two characters @@ following the "M" may identify a monument number to which a collector belongs. The two digits following the "S" may identify an envelope number within a specified monument. In some embodiments, an envelope collector may contain 3D geometry applicable to a configuration of a monument when a corresponding envelope is selected as an option, independently of any choices of configuration zones or design features. For example, in the Global 6000™ dataset, "COL_M01 S02" may be a basic collector for an inboard-curved envelope (S02) of a credenza monument (M01).

As a second example, "M@@ S## Z## C##" may define a zone configuration collector which may contain information about a specific configuration option available for one of the monuments' zones. As for the envelope collector described in the paragraph above, the two characters following "M" and "S" identify a corresponding monument and envelope. A "Z" number may identify a zone and a "C" number may identify a configuration option which the collector may define, one of several that may be available for a particular zone. Pursuing with the example of the Global 6000™ credenza, "COL_M01 S02 Z02 C01" may be the basic collector of a shelf option (C01) for a mid-compartment zone (Z02) within an inboard-curved envelope (S02) of a credenza monument (M01). As an example, other configurations available in a given zone (Z02) may be drawers "COL_M01 S02 Z02 C03" or a minibar , "COL_M01 S02 Z02 C04".

As a third example, "M@@ S## D## C##" may define a design feature collector which may be semantically similar to a zone configuration collector but may define an option for a design feature rather than a zone. The "D" number may identify a design feature and the "C" number may identify an option for that design feature to which the collector pertains. Pursuing with the example of the Global 6000™ credenza, "COL_M01 S02 D28 C01" may be a basic collector of a vertical oval option (C01) for latches (D28) within the inboard-curved envelope (S02) of the credenza monument (M01). Other latch shapes available may be horizontal oval (COL_M01 S02 D28 C02), square (COL_M01 S02 D28 C03) or round (COL_M01 S02 D28 C04).

Collector Cross-Dependencies

In some embodiments, a content of a zone configuration collector or a design feature collector may depend not on only on a configuration choice for a particular part of the monument, but also a choice for other zone and/or design feature of the monument. In such a case, definitions for both of the interdependent collectors may be modified according to one of two conventions, namely a single cross-dependencies convention and a multiple cross-dependencies convention.

Single Cross-Dependencies

As a first example, "M@@ S## Z## C##" or "M@@ S## D## C##" may define a zone configuration collector or a design feature collector which may have an impact on collectors for one or more options elsewhere in the monument's configuration. As a second example, "M@@ S## Z## C##" or "M@@ S## D## C##" may define a zone configuration collector or a design feature collector which may be subordinate to a configuration choice for another part of the monument.

When a monument is configured such that it contains a collector with an X number suffix, any collectors with a Y number suffix also present in the monument configuration are subordinate and must be selected such that the Y numbers match the X numbers. As an example, a Challenger 350™ galley may be configured with a drip tray or a full sink (for the baseline envelope, collectors COL_M03 S01 Z07 C01 X08 and COL_M03 S01 Z07 C02 X09 respectively). This has an impact on the construction of the monument's façade design feature (D32), which must therefore be available in two separate collectors: COL_M03 S01 D32 C01 Y08 and COL_M03 S01 D32 C01 Y09.

A collector named following this "single" configuration may only be used to identify a single cross-dependency. In some embodiments modeling an aircraft cabin interior, no multiple cross-dependencies exist.

Multiple Cross-Dependencies

In some other embodiments, a dataset may contain monuments where a geometry of a particular collector depends, besides its own specific configuration, on configuration choices for multiple other zones or design features. In such a case, a more flexible naming convention may be used. A subordinate collector may be identified with a definition matching "M@@ S## Z## C## [Z## C##]", "M@@ S## Z## C## [Z## C##] [Z## C##]"etc. A bracketed portion of the definition may identify a particular configuration for each of an arbitrary number of different configuration zones, each of which impacts the choice of the subordinate collector. Note that although configuration zones (the "Z" prefix) are used here for simplicity's sake, the subordinate collector or any of its dependencies may also be design features ("D" prefix) or "A"/"B" configurations (see the "Alternate States" section below).

Physical Geometry

Physical objects within Catia documents may be represented by entities called "bodies". Any bodies within an input document processed by the conversion pipeline 221 may be converted to polygon meshes (also referred to as tessellated models) for use in a 3D rendering engine, such as the 3D engine 272. A level of fidelity when converted parametric surfaces, such as, for example, Non-Uniform Rational Basis Splines (NURBS) to polygon meshes may be configurable. In some embodiments, there might be a need to find a suitable trade-off between (1) visual quality, which is better with high-polygon meshes and (2) frame rate, which improves when a number of polygons is lowered.

In some embodiments, each body entity may be associated with a name, which may be used for identifying metadata associated with the body. In some embodiments, how names may be determined may depend on a collector type.

In some embodiments, for basic (i.e., non-SP) collectors, a name may be that of a body node itself, but may have a KBE prefix which may be stripped to match associated metadata. For instance, if a body is contained within a node identified as "BI_KBE_M03_Panel_BI001", the body's name may be "M03_Panel_BI001". It may then be matched with a metadata key of "ATB_M03_Panel_BI001". The prefix of the node name may conform to a pattern "{A . . . }_KBE", where {A . . . } may be a string of letters of arbitrary length. In addition, a name of the body node may be referenced from one of the component's parameter nodes: a parameter node may exist which may have a string value of the form "{BodyName} COL##", where the suffix digits may correspond to a number of the collector (as reflected in its filename). Following the earlier example, a body contained in a node identified as "BI_KBE_M03_Panel_BI001" in collector C350-03-000COL05 may only be processed if there exists a parameter node with a string value of "BI_KBE_M03_Panel_BI001 COL05".

In some other embodiments, for SP collectors, the node name may not contain a KBE prefix to be stripped out, but rather may be given a "VISUALIZE_" prefix. In addition, the node with the "VISUALIZE_" prefix may be the parent of the actual physical geometry node (which typically may have an unrelated name such as ThickSurface.1, Assemble.7, etc.). Body nodes in SP collectors not matching this convention may be ignored. The "VISUALIZE_" prefix may not be stripped when matching metadata keys, for instance, the body name "VISUALIZE_Outlet" is matched with metadata named "ATB_VISUALIZE_Outlet".

Materials and Projections

Along with the polygon mesh for a converted body node, the conversion pipeline 221 may convert the projection mapping for the material associated with the body in the input document. The projection mapping may be defined in Catia™ using the material properties dialog 1102 as illustrated in the screenshot 1100 of FIG. 11. The screenshot 1100 also illustrates "material size" parameter 1104, "mapping" function 1106, "scale U/V" parameter 1108, "position U/V" parameter 1110 and "orientation" parameter 1112. One or more of the parameters/functions 1104-1112 are used to calculate a UV mapping on a polygon mesh so as to ensure that application of textures in the configuration platform 260 matches the way in which they are rendered in Catia™. In some embodiments, restrictions may apply. As a first example, Catia™ may provide for six options for projective texture mapping, namely (1) planar, (2) spherical, (3) cylindrical, (4) cubic, (5) auto adaptive and (6) manual adaptive. In some embodiments, options (5) and (6) may no be supported by the conversion pipeline 221. As a second example, values for "scale U/V", "position U/V" and "orientation" may not be read directly from the body's material properties. Rather, they may be expressed in "parameters" metadata nodes. There are two supported schemes for organizing such nodes, namely "single-value" and "multiple-value". In some embodiments, should the value is not present in metadata nodes, the values default to 1.0 for scale and 0.0 for position and orientation. As a third example, the actual texture image used in Catia™ is ignored, texture images used for rendering in the configuration platform 260 are managed separately in the CMS 220. In some embodiments, a transform associated with a material (which may be indicated by a compass when the material node is selected) may affect a projection as well, it may be taken into account when generating the UV mapping. In some embodiments, the material's finish may be defined in a suitably-named metadata node.

Single-Value Metadata Convention for Material Parameters

In some embodiments, under this scheme, each parameter describing a property of materials application for a particular body entity may be expressed separately as a value of a matching parameter node. Parameters nodes may be named with an "ATB_" prefix followed by a body name (e.g., a name following conventions described above in connection with the description of the non-SP collectors and the SP collectors). In some embodiments, the following keys may be recognized: (1) MType: which may define a material's finish type and (2) MScale U, MScaleV, MPositionU, MPositionV, and MOrientation: which may be used instead of corresponding values in Catia's material properties (see FIG. 11).

As an example, for a non-SP collector body whose node may be named "AA_KBE_M01_Panel_W07_AA_F", the body name (after stripping the KBE prefix) is taken to be "M01_Panel_W07_AA_F" and the associated parameter node names may be "ATB_M01_Panel_W07_AA_F_MType", "ATB_M01_Panel_W07_AA_F_MScaleU" and so forth.

Multiple-Value Metadata Convention for Material Parameters

In some embodiments, under this scheme, all material parameters may be concatenated together into a single parameter node using the "MType" key (prefixed with "ATB_" and the body name as above). The value string may be a string which may be parsed as a pipe-separated list of record tables, records and fields organized which may be organized as described in the paragraph below.

An overall string value may be a list of record tables separated by a string "|||". Each table may be identified by its position in the list and the following may be relevant to materials properties, namely (0) Position 0: TypeFinish family name, (1) Position 1: default material to apply, (2) Position 2: applicable materials and (3) Position 3: component type. Each record table may be a list of records separated by a string "||". Each record may be a list of key-value pairs separated by the string "|" between pairs, the key and value may be separated by the string "=". The value may be optional, when no "=" is present the key may be considered to have no associated value. For example, a record may be found in table 1 (default materials): "TypeFinish007|Description=Plated|Color007=#CBCECA|Orientation=0 deg".

In some embodiments, the material finish type and all mapping parameters (ScaleU, ScaleV, PositionU, PositionV and Orientation) may be found in tables at position 1 (default material) and 2 (full list of applicable materials). In some embodiments, the "M" prefix present in the single-value parameters above (MScaleU, MOrientation) may not be used.

Positions Identifiers (PIDs)

In some embodiments, to place a monument at its intended location within a 3D scene generated by the 3D engine 272, the configuration platform 260 may refer to a set of positions and/or orientation coordinates. These coordinates may be associated with a naming convention that may be referred to as "Positions Identifier" or PIDs. Whereas some monuments may only be place at a single position in the aircraft cabin, irrespectively of any configuration choices, others (e.g., seats) may be present at multiple positions. Two conventions may be used to define an available position or positions that a monument may occupy. In all cases, PIDs may be defined for each of the monument envelopes so that zone and design feature collectors may be positioned using the PID selected for the corresponding envelope collector. A first convention may be referred to as "aircraft origin". A second convention may be referred to as "PID axis systems".

Referring to the first convention, for single-position monuments, an allowable set of coordinates may be identified by a nested Catia document with a special name "AIRCRAFTORIGINPART-KBE". The coordinates of this "virtual part" may be considered to be the point of reference from which an offset to the monument origin may be calculated. In an input document structure, such as the input document structure 1200 illustrated at FIG. 12, it may be a sibling to the monument's collectors. In other words, references to an origin part and the monument collectors may be placed in a same container document as in the example of FIG. 12.

Referring to the second convention, for multiple-position monuments, each set of allowable coordinates may be identified by an "axis system" node in the Catia document. Each node representing a PID may be named with a prefix "DATUM_AXIS_PID_" followed by the PID code itself PID codes may be globally unique across all monuments of all aircraft models.

Lights

Light fixtures in monuments may be defined by body nodes, located in the Catia document for the corresponding collector which may conform to a particular naming convention. Matching nodes may not convert into polygon meshes but rather as handled as a special case. These marker nodes for lights may be present in either base collectors or SP collectors and the naming convention may differ in two cases. First, for non-SP collectors, the marker node may be named as follows: "ENV_M## <light name>Light<light type>Surface_MarkerForKBE". Second, for SP collectors, the marker node may be named as follows: "ENV_Light<light type>Surface_MarkerForKBE". "M##" may be a placeholder for the monument number; <light name> may be a placeholder for the light's identifying name and <light type> may be a place holder for one of the three different supported types of light: "Spot" for spot lights, "Point" point lights and "Shape" for shaped lights.

The light's spatial parameters may be defined by several associated body nodes which may be present along with the "Surface" marker node. The number and nature of these complementary nodes may depend on the type of light being defined.

Point Lights

Point lights project light in all directions from a single point in space. An example 1302 is provided at FIG. 13. The marker surface must be a geometric body containing a sphere whose centre may be the point from which light is emitted. No complementary nodes may be required for point lights. The only item of information which may be required is the location of a center of a sphere.

Shaped Lights

Like point lights, shaped lights emit in all directions. However, the source is not a single point but rather a capsule shape. These lights therefore behave in much the same way as a straight fluorescent tube. An example 1304 is provided at FIG. 13. The marker surface may be a geometric body containing a cylinder whose shape and position may match the "tube" from which light may be projected. No complementary nodes may be required for point lights. The position, length and radius of the cylinder may be used for determining parameters of the light.

Spot Lights

Spot lights project a cone-shaped field of light from a single point in space. The marker surface may be a geometric body node containing a cone which may match a shape of a beam. An example 1306 is provided at FIG. 13. The tip of the cone may mark a conceptual origin of the light field and may not be normally positioned at the location of a physical light fixture itself A complementary node, whose name may be prefixed with the following string may be present (example is given for non-SP collectors): "ENV_M## <light name>_LightSpotCircle". A geometric body node may contain a circle positioned to match the surface of a light fixture to distinguish the actual physical source of the light from the tip of the cone.

Hotspots

Hotspots (also referred to as annotations), including annotation points, may be defined by body nodes, located in the Catia document for a corresponding collector which may conform to a particular naming convention. Matching nodes may not have to be converted into polygon meshes but rather may be handled as a special case. A single-point body node, whose name may begin with the prefix "ANN_" may be treated as a hotspot. There must also be a parameter node a matching name, used to indicate a type of hotspot. Hotspot type may be as follows. First, "C00_T01" and "C00_T02". A point used to position a UI element specific to the monument, in order to provide means of performing various actions or retrieving multimedia information (text, images, video) related to a monument. The two variants may be used for non-seat monuments (T01) and seats (T02). These hotspots may be present in envelope collectors. Second, "C01_T01" and "C01_T02". A point used to position annotation callouts within a monument in a utility view of the configuration platform 260. The two variants may be used for outer monument annotations (T01) and inner monument annotations (T02).

Alternate States

Certain monuments may be represented in more than one state or position. For instance, a divan may be berthed or deployed, galley drawers may be open or closed. In some embodiments, a kinematic sequence is further associated to allow real-time representation of a monument transitioning from a first state (galley drawers open) to a second state (galley drawers closed). These are identified by an extension of the collector naming convention, similar to the way configuration zones and design features may be identified. When part of a monument exists in multiple states, the affected geometry may be gathered into collectors with identifiers matching the pattern "M## S## B## C##" or "M## S## A## C##" (the "B" initial may represent a "behaviour" of the monument). As it is the case with configuration zones and design features, only one of the available collectors for a given behaviour may be present in the 3D scene at any given time.

Special Cases

Collectors identified with a C01 configuration may be considered the default. They may be used in the main cabin view. Collectors whose part-level "Nomenclature" metadata text may contain the word "Door" followed by the word "Hidden" correspond to the "hidden doors" configuration. They may be used in the utility view of the configuration platform 260 to enable a user to see an inside of a monument's storage compartment.

Examples

The Challenger galley has many instances of alternate states, so it may be used in all the following examples. For simplicity's sake identifiers will be shortened to omit the "M03 S05" prefix. One of the simplest cases would be the tambour doors, which may be either closed or open. Therefore, there is one collector for the "closed" state, identified (without the M03 S05 prefix) as B26 C01, and a corresponding alternate collector for the "open" state, identified as B26 C02.

When the resulting collectors are also affected by a configuration zone with multiple options, the result is a part whose geometry varies in function of several independent configuration choices, so that the X/Y identifier suffix may be required. For instance, the configuration of certain drawers may be affected by whether the galley is configured with a sink or a drip tray (configuration zone Z07). The drawers may also be either open or closed; there are therefore four different possible states of the drawer. This is represented by assigning an X suffix to the sink/drip tray configuration zone, so that its two collectors become Z07 C01 X01 (sink) and Z07 C02 X02 (drip tray). That allows the drawer geometry to depend both on the Z07 configuration and the open/closed state, by identifying the following collectors: B24 C01 Y01, closed drawer when sink option is selected; B24 C01 Y02, closed drawer when drip tray option is selected; B24 C02 Y01, open drawer when sink option is selected; B24 C02 Y02, open drawer when drip tray option is selected.

The final example illustrates the case where the part involved in an alternate state itself is a configuration zone. This differs from the previous case because there is no separate configuration zone which can be used as a basis for the X/Y suffix, so it may be necessary to create a placeholder collector with no geometry. Consider a drawer which may be configured with or without a pull-out work surface, and may also be represented open or closed. The first two collectors below are the alternate state placeholders; the rest are the geometry collectors representing the four possible representations of the drawer: B03 C01 X03, closed state placeholder; B03 C02 X04, open state placeholder; Z03 C01 Y03, closed drawer without pull-out surface; Z03 C02 Y03, closed drawer with pull-out surface; Z03 C01 Y04, open drawer without pull-out surface; Z03 C02 Y04, open drawer without pull-out surface.

Figure 14:
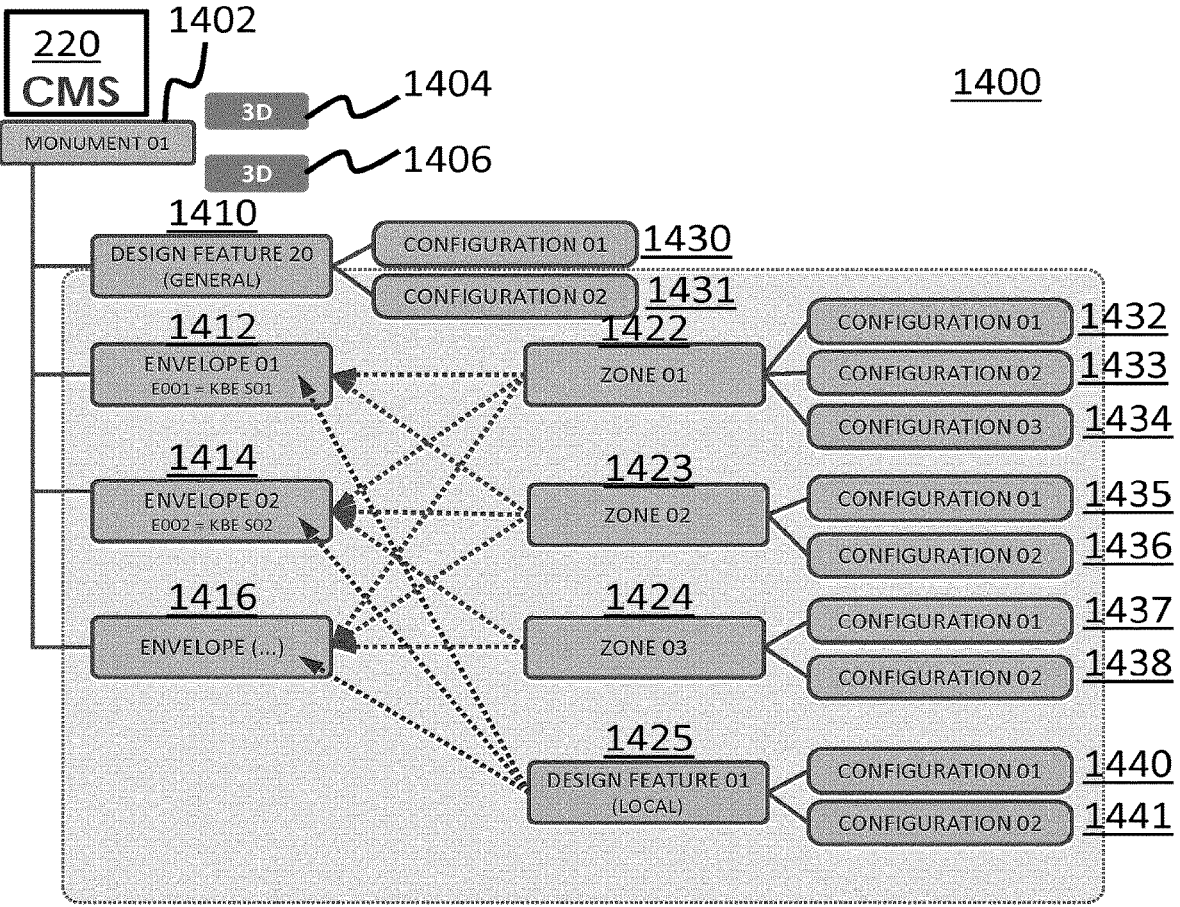
FIGS. 14 and 15 illustrate examples of multiple levels of configuration and collectors in accordance with embodiments of the present technology.
Figure 15:
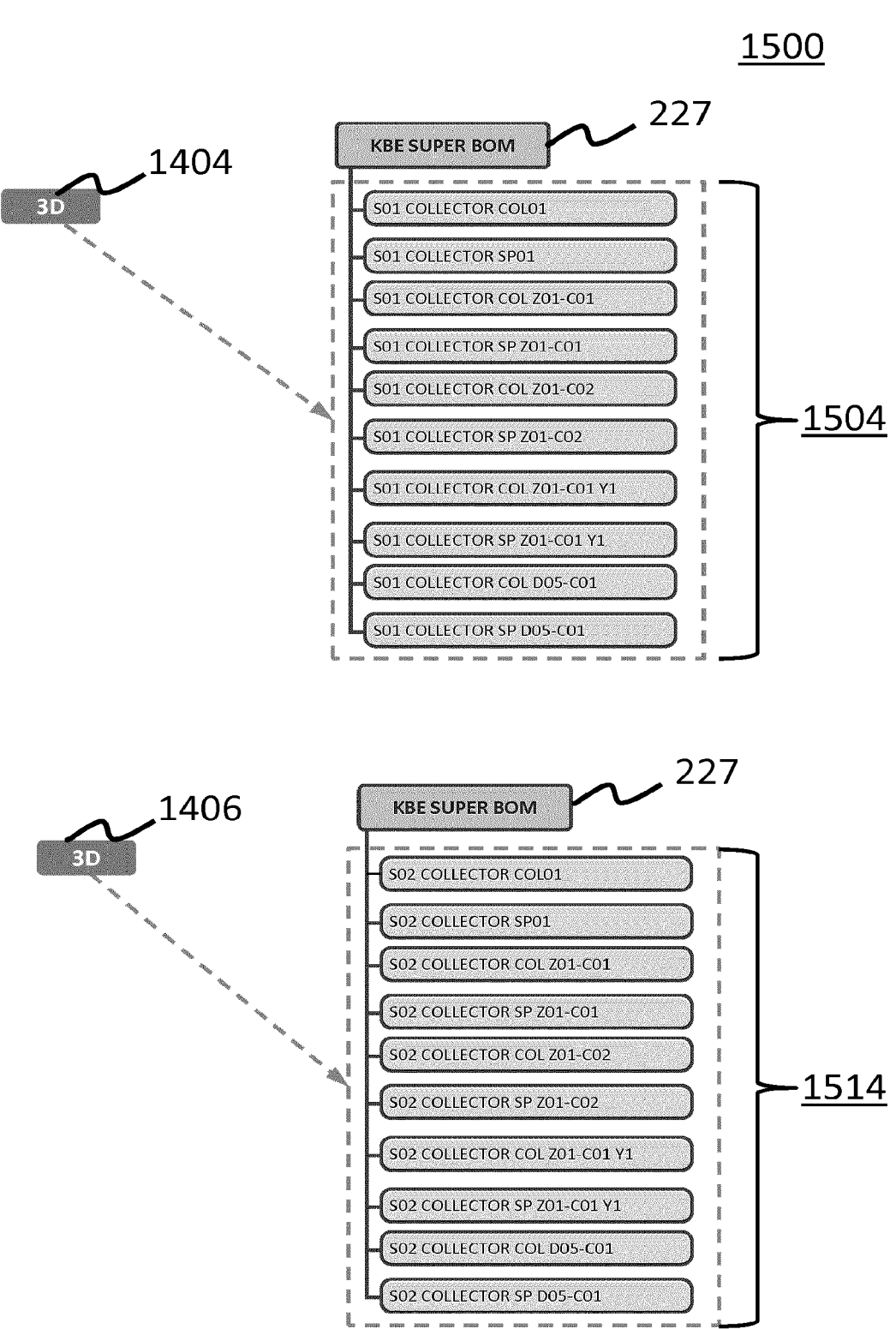

Turning now to FIGS. 14 and 15, examples of multiple levels of configuration and collectors generated based on such configuration are illustrated. FIG. 14 illustrates a "Monument 01" 1402 which may have been accessed from the CMS 220. The "Monument 01" 1402 may be associated with a first 3D object 1404 and a second 3D object 1406.

FIG. 14 illustrates three levels of configurations, namely a monument envelope, a configuration zone and design features. In the illustrated example, the "Monument 01" 1402 is associated with three monument envelopes 1412, 1414 and 1416. Each one of the monument envelope may be associated with with a given variation of the monument. Each one of the monument envelopes 1412, 1414 and 1416 may be associated with one or more configuration zones, such as the configuration zones 1422, 1423 and 1424. Each one of the configuration zones may be associated with one or more configurations. As an example, the configuration zone 1422 is associated with "Configuration 01" 1432, "Configuration 02" 1433 and "Configuration 03" 1434. As another example, the configuration zone 1423 is associated with "Configuration 01" 1435 and "Configuration 02" 1436. As another example, the configuration zone 1424 is associated with "Configuration 01" 1437 and "Configuration 02" 1438. In some embodiments, "Configuration 01" 1432, "Configuration 01" 1435 and "Configuration 01" 1437 are similar. In some embodiments, "Configuration 02" 1433, "Configuration 02" 1436 and "Configuration 02" 1438 are similar.

In addition, to the monument envelope and the configuration zone, the "Monument 01" 1402 may be associated with a general design feature "Design Feature 20" 1410 and a local design feature "Design Feature 01" 1425. The general design feature "Design Feature 20" 1410 may be reflective of a configuration that may apply independently of the monument envelope and/or the configuration zone while the local design feature "Design Feature 01" 1425 may depend from the monument envelope and/or the configuration zone. In the illustrated example, the general design feature "Design Feature 20" 1410 is associated with "Configuration 01" 1430 and "Configuration 02" 1431 and the local design feature "Design Feature 01" 1425 is associated with "Configuration 01" 1440 and "Configuration 02" 1441.

FIG. 15 illustrates examples of data collectors associated with the first 3D object 1404 and the second 3D object 1406 of FIG. 14. A first set of data collectors 1504 is associated with the first 3D object 1404 and a second set of data collectors 1514 is associated with the second 3D object 1406. In the illustrated embodiments, both the first set of data collectors 1504 and the second set of data collectors 1514 are stored into the Super BOM Library 227. In other embodiments, the first set of data collectors 1504 and the second set of data collectors 1514 may be accessed from a different database and/or directly accessed from the conversion pipeline 221. As can be seen, the first set of data collectors 1504 is associated with a first monument envelope (Shape 01) of the "Monument 01" 1402 and comprises both basic collectors (e.g., "S01 COLLECTOR COL01", "S01 COLLECTOR COL Z01-C01") and standard part collectors (e.g., "S01 COLLECTOR SP01", "S01 COLLECTOR SP Z01-C01"). In the illustrated example of FIG. 15, the second set of data collectors 1514 is associated with a second monument envelope (Shape 02) of the "Monument 01" 1402 and comprises both basic collectors (e.g., "S02 COLLEC-TOR COL01", "S02 COLLECTOR COL Z01-C01") and standard part collectors (e.g., "S02 COLLECTOR SP01", "S02 COLLECTOR SP Z01-C01").

Rules Application

Turning now to FIG. 16, embodiments of rule formats 1602 and 1606 and a rule example 1604 are provided. In some embodiments, the rule formats 1602 and 1606 may be relied upon to execute a method of applying configuration rules while operating the configuration platform 260. In some embodiments, execution of the method of applying configuration rules may be executed by the rule engine 275. In some embodiments, rules and/or rule formats may be edited via the rules authoring module 225. In some embodiments, rules, stored as configuration rules data in accordance with rule formats (such as, but not limited to, the rule formats 1602 and 1606), may be accessed. The configuration rules data model internal monument configuration rules and external monument configuration rules. In some embodiments, the internal monument configuration rules may relate to an internal configuration of the monument affecting the monument itself. In some embodiments the external monument configuration rules may relate to an external configuration of the monument affecting an environment in which the monument is to be represented. Once accessed, the configuration rules data may then be applied, for example by the rule engine 275, to a monument before being rendered by the 3D engine 272 so as to present a visual representation of the monument which takes into consideration the various configuration rules. As an example, a divan positioned in a vicinity of an exit door may trigger a configuration rule which require a particular configuration of the divan to be selected and/or represented. The particular configuration of the divan may comprise specific features (such as a removable backrest) compatible with the position of the divan in front of the exit door.

As a first example, the rule format 1602 is structured in a three folds logic structure, namely "IF:-- THEN:-- IS: --". The rule example 1604 illustrates an example of a rule structured in accordance with the rule format 1602. The rule example 1604 allows defining whether certain options, monuments and/or design features are inherent, mandatory, not available or optional. As an example, but without being limitative, the rule example 1604 may model a rule according to which IF: "ZONE CONFIGURATION=02", THEN: "DIVAN", IS: "MANDATORY". This example may translate as if zone configuration=02 then a divan is mandatory and is to be represented/positioned into zone configuration 02.

As a second example, the rule format 1606 is structured in a three folds logic structure, namely "IF:-- THEN:-- WITH: --". As an example, but without being limitative, the rule format may define the structure of a rule example modeling a rule according to which IF: "ZONE CONFIGU-RATION=02", THEN: "DIVAN", WITH: "LARGE RIGHT ARMREST". This example may translate as if zone configuration=02 then a divan with a large right armrest is to be represented/positioned into zone configuration 02.

Seat Configuration

Figure 17:
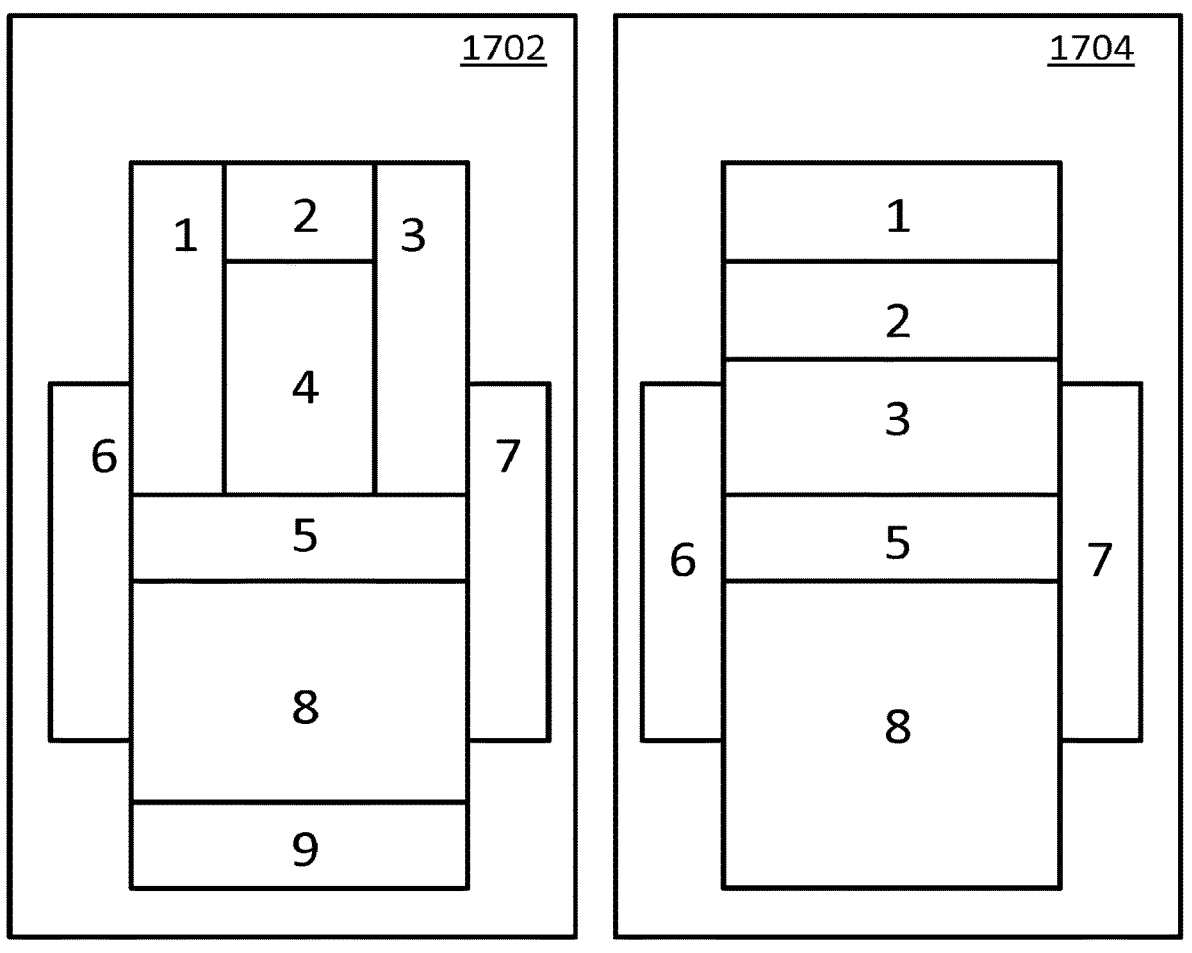
FIGS. 17 and 18 illustrate embodiments of a method of propagating a configuration setting of a 3D model in accordance with embodiments of the present technology.
Figure 18:
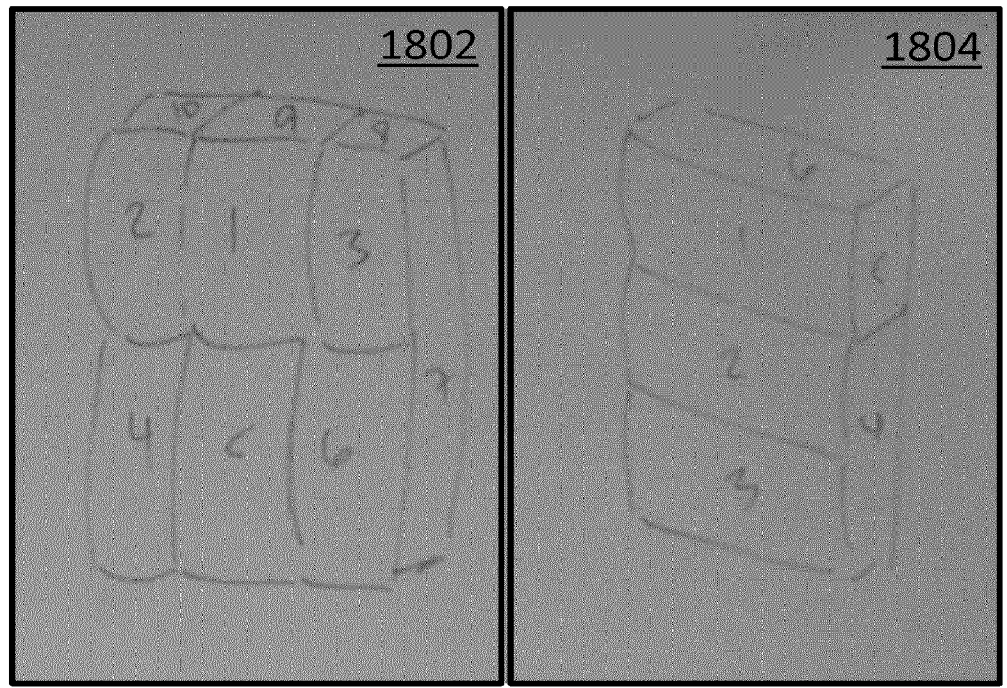

Turning now to FIGS. 17 and 18, embodiments of a method of propagating a configuration setting of a 3D model to other 3D models is illustrated. The method may be implemented by the seat configuration engine 274 of the configuration platform 260. In accordance with embodiments of the present technology, the method may allow configuring a particular 3D model in accordance with a given configuration and then propagate the given configuration to other 3D models without a need to (re)configure each one of the other 3D models manually. As an example, a 3D model may be a first seat and a given configuration may comprise one or more of a shape, a layout, a selection of material type (e.g., certain patterns on a backrest, other patterns on the leg rest, a particular layout and/or color of pow lines, a particular wood selection for the armrest, a particular selection of leathers, etc). A first seat may be an aircraft cabin seat. In this example, other 3D models may be a second seat, a third seat, etc. As a result of the execution of the method of propagating a configuration setting of a 3D model to other 3D models, a user may configure the first seat by selecting the required configuration and may propagate the required configuration to the second seat, the third seat, etc without having to manually configure each one of the second seat and the third seat.

In this example, a 3D model category is an aircraft cabin seat category but it should be envisioned that other types of 3D objects may be used in conjunction with the method of propagating a configuration setting of a 3D model to other 3D models without departing from the scope of the present technology (e.g., the 3D objects may be associated credenzas, side ledges, divans, etc).

In the example of FIG. 17, the 3D model is a first aircraft cabin seat 1702 and another 3D model is a second aircraft cabin 1704. As it may be appreciated by a person skilled in the art of the present technology, FIG. 17 represents a front view of the first aircraft cabin seat 1702 and a front view of the second aircraft cabin seat 1704. The first aircraft cabin seat 1702 has a first layout while the aircraft cabin seat 1704 has a second layout, distinct from the first layout. In some embodiments, the first layout may be defined by a first pow line pattern (e.g., defining four surfaces for the back rest) while the second layout may be defined by a second pow line pattern (e.g., defining three surfaces for the back rest).

In accordance with some embodiments of the present technology, the first aircraft cabin seat 1702 is divided into a plurality of surfaces. The first aircraft cabin seat 1702 may define a 3D model. The plurality of surfaces are 3D model surfaces that are visible to the user upon being rendered by the 3D engine 272. In the embodiment of FIG. 17, the plurality of surfaces comprises four surfaces defining a back rest, one surface defining a cushion, two surfaces defining a leg rest and two surfaces defining a left armrest and a right armrest. In accordance with the method, each one of the plurality of surfaces is associated with a unique surface identifier. In the example of FIG. 17, a first unique surface identifier "1" is associated with one of the surfaces of the back rest, a second unique surface identifier "2" is associated with one of the surfaces of the back rest, a third unique surface identifier "3" is associated with one of the surfaces of the back rest, a fourth unique surface identifier "4" is associated with one of the surfaces of the back rest, a fifth unique surface identifier "5" is associated with the surface of the cushion, a sixth unique surface identifier "6" is associated with the right armrest, a seventh unique surface identifier "7" is associated with the left armrest, an eight unique surface identifier "8" is associated with one of the surfaces of the leg rest and a ninth unique surface identifier "9" is associated with one of the surfaces of the leg rest.

The second aircraft cabin seat 1704 may define another 3D model being part of a same 3D model category than the first aircraft cabin seat 1702 (i.e., aircraft cabin seat category). As for the first aircraft cabin seat 1702, the second aircraft cabin seat 1704 may be divided into a plurality of surfaces. The plurality of surfaces are 3D model surfaces that are visible to the user upon being rendered by the 3D engine 272. In the embodiment of FIG. 17, the plurality of surfaces comprises three surfaces defining a back rest, one surface defining a cushion, one surface defining a leg rest and two surfaces defining a left armrest and a right armrest. In accordance with the method, a correspondence is established between the plurality of surfaces of the first aircraft cabin seat 1704 and another plurality of surfaces of the second aircraft cabin seat 1706. The correspondence may be established based on correspondences between the 3D model associated with the first aircraft cabin seat 1704 and another 3D model associated with the second aircraft cabin seat 1706. In some embodiments, the correspondence may be based on data generated and/or stored by the CMS 220 (e.g., the Super BOM Library 227, the Super BOM Meta Data 228, the Material Library 224). Once the correspondence is established, the method associates, for each one of the plurality of surfaces of the second aircraft cabin seat 1706, the unique surface identifier associated with the corresponding one of the plurality of surfaces of the first aircraft cabin seat 1704. In the illustrated example, the method associates the first unique surface identifier "1" with one of the surfaces of the back rest, the second unique surface identifier "2" with one of the surfaces of the back rest, the third unique surface identifier "3" with one of the surfaces of the back rest, the fifth unique surface identifier "5" with the surface of the cushion, the sixth unique surface identifier "6" with the right armrest, the seventh unique surface identifier "7" with the left armrest and the eight unique surface identifier "8" with the surface of the leg rest. In the illustrated embodiment, determination has been made that the second aircraft cabin seat 1704 did not have surfaces corresponding to the unique surface identifier "4" and "9" of the first aircraft cabin seat 1702.

Once the correspondence between the plurality of surfaces of the first aircraft cabin seat 1704 and another plurality of surfaces of the second aircraft cabin seat 1706 is established, the method may determine a configuration setting to be applied to one or more of the plurality of surfaces of the first aircraft cabin seat 1704 and then propagate the configuration setting to the second aircraft cabin seat 1704.

In accordance with the above-described method, a user may select a wood material to be applied on the surfaces of the left armrest and of the right armrest of the first aircraft cabin seat 1702 and the method may automatically apply the wood material to the surfaces of the left armrest and of the right armrest of the second aircraft cabin seat 1704. As another example, a user may select a leather material to be applied on the surfaces of a portion of the back rest of the first aircraft cabin seat 1702 and the method may automatically apply the leather material to the corresponding surfaces of the back rest of the second aircraft cabin seat 1704.

Another example of how a 3D model is divided into a plurality of surfaces and how correspondence are established with a plurality of surfaces of another 3D model is provided at FIG. 18. FIG. 18 illustrates a first aircraft cabin seat back rest 1802 and a second aircraft cabin seat back rest 1804 in which correspondences have been established.

Having described, with reference to FIG. 1 to FIG. 18, some non-limiting example instances of systems and computer-implemented methods used in connection with operating a configuration platform, we shall now describe a general aproach with references to FIG. 19 to FIG. 23.

More specifically, FIG. 19 shows a flowchart illustrating a first computer-implemented method 1900 implementing embodiments of the present technology. The computer-implemented method of FIG. 19 may comprise a computer-implemented method of converting a first set of data associated with a computer-aided design (CAD) system polygon meshes and configuration data, the method being executable by a processor of the one or more servers 240, 242 and 244, the method comprising a series of steps to be carried out by the one or more servers 240, 242 and 244.

The computer-implemented method of FIG. 19 may be carried out, for example, in the context of the one or more servers 240, 242 and 244 by the processor 110 executing program instructions having been loaded into random access memories 130 from solid-state drives 120 of the one or more servers 240, 242 and 244 to implement the conversion pipeline 221.

The method 1900 starts at a step 1902 by accessing the first set of data, the first set of data defining a data collector associated with a monument of an aircraft cabin interior, the data collector comprising a body defining a 3D object representative of at least a portion of the monument and metadata defining information associated with the 3D object. Then, at a step 1904, the method proceeds to converting the body into polygon meshes suitable for rendering by a 3D real-time engine of a configuration platform.

Then, at a step 1906, the method proceeds to generating, based on an analysis of the metadata, configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument.

At a step 1908, the method proceeds to compiling the polygon meshes and the configuration data in a data format suitable for representation and behaviours by the 3D real-time engine.

In some embodiments, the data collector comprises one of a basic collector and a standard part collector, the basic collector being associated with a representation of a structure of the portion of the monument and the standard part collector being associated with a representation of accessories associated with the portion of the monument.

In some embodiments, the metadata defines at least one of a configurability of the monument and a relationship of the data collector with other data collectors defining other portions of the monument. In some embodiments, the data collector defines at least one of an envelope collector, a zone configuration collector and a design feature collector. In some embodiments, the envelope collector, the zone configuration collector and the design feature collector defines available configuration permutations of the monument.

In some embodiments, the zone configuration collector depends from another zone configuration collector. In some embodiments, the design feature collector depends from another design feature collector. In some embodiments, the zone configuration collector depending from another zone configuration collector and the design feature collector depending from another design feature collector comprises one of a single cross-dependency and a multiple cross-dependency. In some embodiments, converting the body into the polygon meshes further comprises converting projection mapping of a material associated with the body. In some embodiments, the method 1900 further comprises calculating a UV mapping on the polygon mesh. In some embodiments, the body is further associated with parameters defining a property of the material, the parameters being reflective of at least one of a finish type associated with the material, a scale associated with the material, a position associated with the material, a position associated with the material and a position associated with the material.

In some embodiments, the monument is associated with a position identifier allowing positioning of the monument within the aircraft cabin interior. In some embodiments, the method 1900 further comprises further to accessing the first set of data, proceeds to parsing the first set of data.

More specifically, FIG. 20 shows a flowchart illustrating a second computer-implemented method 2000 implementing embodiments of the present technology. The computer-implemented method of FIG. 20 may comprise a computer-implemented method of operating a configuration platform, the method being executable by a processor of the one or more servers 240, 242 and 244, the method comprising a series of steps to be carried out by the one or more servers 240, 242 and 244.

The computer-implemented method of FIG. 20 may be carried out, for example, in the context of the one or more servers 240, 242 and 244 by the processor 110 executing program instructions having been loaded into random access memories 130 from solid-state drives 120 of the one or more servers 240, 242 and 244 to implement the client side application 270.

The method 2000 starts at a step 2002 by accessing, from a content management system, monument data representative of at least a portion of a monument of an aircraft cabin interior, the monument data comprising polygon meshes suitable for rendering of the portion of the monument by a 3D real-time engine and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument.

Then, at a step 2004, the method proceeds to determining, based on the configuration data, at least one of the positioning of the monument, the material surface associated with the monument, the material grain direction associated with the monument, the lighting associated with the monument, the annotations associated with the monument, the alternate states associated with the monument and the kinematic sequence associated with the monument.

Then, at a step 2006, the method proceeds to rendering the portion of the monument by the 3D real-time engine.

In some embodiments, the configuration data is associated with one of a basic collector and a standard part collector, the basic collector being associated with a representation of a structure of the portion of the monument and the standard part collector being associated with a representation of accessories associated with the portion of the monument.

In some embodiments, the one of the basic collector and the standard part collector defines a configurability of the monument and a relationship of the one of the basic collector and the standard part collector with other collectors defining the monument.

In some embodiments, the one of the basic collector and the standard part collector defines at least one of an envelope collector, a zone configuration collector and a design feature collector.

In some embodiments, the envelope collector, the zone configuration collector and the design feature collector defines available configuration permutations of the monument.

In some embodiments, the body is further associated with parameters defining a property of the material, the parameters being reflective of at least one of a finish type associated with the material, a scale associated with the material, a position associated with the material, a position associated with the material and a position associated with the material.

In some embodiments, the monument is associated with a position identifier allowing positioning of the monument within the aircraft cabin interior.

In some embodiments, the rendering is based on at least one of the one of the basic collector and the standard part collector, the parameters defining the property of the material and the position identifier.

More specifically, FIG. 21 shows a flowchart illustrating a third computer-implemented method 2100 implementing embodiments of the present technology. The computer-implemented method of FIG. 21 may comprise a computer-implemented method of of updating a content management system associated with a configuration platform, the method being executable by a processor of the one or more servers 240, 242 and 244, the method comprising a series of steps to be carried out by the one or more servers 240, 242 and The computer-implemented method of FIG. 21 may be carried out, for example, in the context of the one or more servers 240, 242 and 244 by the processor 110 executing program instructions having been loaded into random access memories 130 from solid-state drives 120 of the one or more servers 240, 242 and 244 to implement the material bridge 223.

The method 2100 starts at a step 2102 by accessing the content management system, the content management system comprising monument data representative of a monument of an aircraft cabin interior, the monument data comprising polygon meshes suitable for rendering of at least a portion of the monument by a 3D real-time engine and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument.

Then, at a step 2104, the method proceeds to accessing parameters defining a property of a material, the parameters being reflective of at least one of a finish type associated with the material, a scale associated with the material, a position associated with the material and a position associated with the material.

Then, at a step 2106, the method proceeds to defining applicability of the parameters to the monument. Then, at a step 2108, the method proceeds to assigning, based on the defined applicability of the parameters to the monument, a component identifier to the monument data and to other monuments data based on a relationship between the monument data and the other monuments data.

In some embodiments, the method 2100 further comprises modifying the applicability of the parameters to the monument and propagating the applicability to the monument data and to the other monuments data.

More specifically, FIG. 22 shows a flowchart illustrating a fourth computer-implemented method 2200 implementing embodiments of the present technology. The computer-implemented method of FIG. 22 may comprise a computer-implemented method of of applying configuration rules, the configuration rules relating to an operation of a configuration platform, the method being executable by a processor of the one or more servers 240, 242 and 244, the method comprising a series of steps to be carried out by the one or more servers 240, 242 and 244.

The computer-implemented method of FIG. 22 may be carried out, for example, in the context of the one or more servers 240, 242 and 244 by the processor 110 executing program instructions having been loaded into random access memories 130 from solid-state drives 120 of the one or more servers 240, 242 and 244 to implement the rule engine 275.

The method 2200 starts at a step 2202 by accessing, from a content management system, monument data representative of a monument of an aircraft cabin interior, the monument data comprising polygon meshes suitable for rendering of a portion of the monument by a 3D real-time engine and configuration data, the configuration data comprising at least one of a positioning of the monument, a material surface associated with the monument, a material grain direction associated with the monument, lighting associated with the monument, annotations associated with the monument, alternate states associated with the monument and a kinematic sequence associated with the monument.

Then, at a step 2204, the method proceeds to accessing configuration rules data, the configuration rules data modeling internal monument configuration rules and external monument configuration rules, the internal monument configuration rules relating to an internal configuration of the monument affecting the monument itself and the external monument configuration rules relating to an external configuration of the monument affecting an environment in which the monument is to be represented.

Then, at a step 2206, the method proceeds to applying at least a subset of the configuration rules data to the monument data Then, at a step 2208, the method proceeds to rendering the monument by the 3D real-time engine, the rendering being based on the internal configuration rules and the external configuration rules to represent the portion of the monument.

In some embodiments, the method 2200 further comprises editing the configuration rules data by at least one adding internal monument configuration rules or external monument configuration rules, removing internal monument configuration rules or external monument configuration rules and modifying internal monument configuration rules or external monument configuration rules.

In some embodiments, the configuration rules model at least one of certification constraints, a position of a bulkhead within the aircraft cabin interior, available configurations of the monument for a given position of the monument within the aircraft cabin interior.

In some embodiments, the rendering further comprises positioning the monument within the aircraft cabin interior based on the configuration rules.

In some embodiments, the rendering further comprises selecting a representation of the monument based on the configuration rules.

In some embodiments, the configuration rules comprise a status to be associated to the monument upon meeting configuration conditions, the status consisting of one of inherent, mandatory, unavailable, available and replace with.

In some embodiments, the configuration conditions are based on at least one of an option associated with the monument, the monument, an envelope of the monument, a zone configuration associated with the monument and a design feature configuration associated with the monument.

In some embodiments, the configuration data is associated with one of a basic collector and a standard part collector, the basic collector being associated with a representation of a structure of the monument and the standard part collector being associated with a representation of accessories associated with the portion of the monument.

In some embodiments, the one of the basic collector and the standard part collector defines a configurability of the monument and a relationship of the one of the basic collector and the standard part collector with other collectors defining the monument.

In some embodiments, the one of the basic collector and the standard part collector defines at least one of an envelope collector, a zone configuration collector and a design feature collector.

In some embodiments, the configuration conditions are based on at least one of the envelope collector, the zone configuration collector and the design feature collector.

More specifically, FIG. 23 shows a flowchart illustrating a fifth computer-implemented method 2300 implementing embodiments of the present technology. The computer-implemented method of FIG. 23 may comprise a computer-implemented method of propagating a configuration setting of a 3D model to other 3D models, the 3D model and the other 3Ds being part of a same 3D model category, the method being executable by a processor of the one or more servers 240, 242 and 244, the method comprising a series of steps to be carried out by the one or more servers 240, 242 and 244.

The computer-implemented method of FIG. 23 may be carried out, for example, in the context of the one or more servers 240, 242 and 244 by the processor 110 executing program instructions having been loaded into random access memories 130 from solid-state drives 120 of the one or more servers 240, 242 and 244 to implement the seat configuration engine 274.

The method 2300 starts at a step 2302 by dividing the 3D model into a first plurality of surfaces, the first plurality of surfaces being 3D model surfaces visible upon being rendered by a 3D engine.

Then, at a step 2304, the method proceeds to associating to each one of the first plurality of surfaces, a unique surface identifier.

Then, for each one of the other 3D models, the method proceeds to steps 2306-2310. The step 2306 comprises dividing the one of the other 3D models into a second plurality of surfaces. The step 2308 comprises establishing a correspondence between at least some of the second plurality of surfaces and at least some of the first plurality of surfaces, based on a correspondence between the 3D model and the one of the other 3D models. The step 2310 comprises associating, for each one of the second plurality of surfaces corresponding to one of the first plurality of surfaces, the unique surface identifier associated with the corresponding one of the first plurality of surfaces.

At a step 2312, the method proceeds to selecting the configuration setting of the 3D model. Then, at a step 2314, the method proceeds to determining the unique identifier of the 3D model to which the configuration setting is to be applied. Then, at a step 2316, the method proceeds to propagating, based on the unique identifier of the 3D model, the configuration setting to the other 3D models to which the configuration setting is to be applied.

In some embodiments, the 3D model is an aircraft cabin seat. In some embodiments, the first plurality of surfaces comprises a plurality of the surfaces of the aircraft cabin seat. In some embodiments, selecting the configuration setting comprises selecting a material type of the aircraft cabin seat. In some embodiments, propagating the configuration setting comprises propagating a selection of the material type of an aircraft cabin seat to other aircraft cabin seats.

While the above-described implementations have been described and shown with reference to particular steps performed in a particular order, it will be understood that these steps may be combined, sub-divided, or re-ordered without departing from the teachings of the present technology. Accordingly, the order and grouping of the steps is not a limitation of the present technology.

It should be expressly understood that not all technical effects mentioned herein need to be enjoyed in each and every embodiment of the present technology. For example, embodiments of the present technology may be implemented without the user enjoying some of these technical effects, while other embodiments may be implemented with the user enjoying other technical effects or none at all.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A method of operating a configuration platform for real-time configuration and real-time visualization of 3D models of a monument of an aircraft cabin interior, the method comprising:

accessing, from a content management system, monument data representative of at least a portion of the monument, the monument data comprising polygon meshes suitable for rendering of the portion of the monument by a 3D real-time engine and configuration data, the configuration data comprising a kinematic sequence associated with the monument;

capturing information relating to a country of certification of the aircraft;

accessing, from a content management system, configuration rules data modeling internal monument configuration rules and external monument configuration rules, the internal monument configuration rules relating to an internal configuration of the monument affecting the monument itself, the external monument configuration rules relating to an external configuration of the monument affecting an environment in which the monument is to be represented, at least one subset of the configuration rules data modeling certification constraints corresponding to a country of certification of the aircraft;

applying at least one subset of the configuration rules data to the monument data, resulting in generated configuration data that complies with regulations of the country of certification;

determining, based on the generated configuration data, the kinematic sequence associated with the monument; and rendering a real-time visualization of the portion of the monument by the 3D real-time engine within the configuration platform.

2. The method of claim 1, wherein the configuration data is associated with one of a basic collector and a standard part collector, the basic collector being associated with a representation of a structure of the portion of the monument and the standard part collector being associated with a representation of accessories associated with the portion of the monument.

3. The method of claim 2, wherein the one of the basic collector and the standard part collector defines a configurability of the monument and a relationship of the one of the basic collector and the standard part collector with other collectors defining the monument.

4. The method of claim 3, wherein the one of the basic collector and the standard part collector defines at least one of an envelope collector, a zone configuration collector and a design feature collector.

5. The method of claim 4, wherein the envelope collector, the zone configuration collector and the design feature collector define available configuration permutations of the monument.

6. The method of claim 5, wherein the basic collector comprises a body defining a 3D object representative of at least a portion of the monument and wherein the body is further associated with parameters defining a property of a material surface associated with the monument, the parameters being reflective of at least one of a finish type associated with the material surface, a scale associated with the material surface, and a position associated with the material surface.

7. The method of claim 6, wherein the monument is associated with a position identifier allowing positioning of the monument within the aircraft cabin interior.

8. The method of claim 7, wherein the rendering is based on at least one of the one of the basic collector and the standard part collector, the parameters defining the property of the material and the position identifier.

9. A computer-implemented system defining a configuration platform for real-time configuration and real-time visualization of 3D models of a monument of an aircraft cabin interior, the system comprising:

a processor;

a non-transitory computer-readable medium coupled to the processor and storing instructions executable by the processor and configured to cause the processor to perform:

accessing, from a content management system, monument data representative of at least a portion of the monument, the monument data comprising polygon meshes suitable for rendering of the portion of the monument by a 3D real-time engine and configuration data, the configuration data comprising a kinematic sequence associated with the monument;

capturing information relating to a country of certification of the aircraft;

accessing, from a content management system, configuration rules data modeling internal monument configuration rules and external monument configuration rules, the internal monument configuration rules relating to an internal configuration of the monument affecting the monument itself, the external monument configuration rules relating to an external configuration of the monument affecting an environment in which the monument is to be represented, at least one subset of the configuration rules data modeling certification constraints corresponding to a country of certification of the aircraft;

applying at least one subset of the configuration rules data to the monument data, resulting in generated configuration data that complies with regulations of the country of certification;

determining, based on the generated configuration data, the kinematic sequence associated with the monument; and rendering a real-time visualization of the portion of the monument by the 3D real-time engine within the configuration platform.

10. A computer-implemented system configured to perform the method according to claim 1.

11. A non-transitory computer-readable medium comprising computer-executable instructions that cause a system to execute the method according to claim 1.

* * * * *